US012757553B2

(12) United States Patent
Liu et al.

(10) Patent No.: US 12,757,553 B2
(45) Date of Patent: Oct. 6, 2026

(54) LED DEVICE AND METHOD OF MANUFACTURE

(71) Applicant: PORO TECHNOLOGIES LTD, Cambridge (GB)

(72) Inventors: Yingjun Liu, Cambridge (GB); Tongtong Zhu, Cambridge (GB); Muhammad Ali, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 810 days.

(21) Appl. No.: 18/040,524

(22) PCT Filed: Aug. 4, 2021

(86) PCT No.: PCT/GB2021/052019

§ 371 (c)(1),
(2) Date: Feb. 3, 2023

(87) PCT Pub. No.: WO2022/029433

PCT Pub. Date: Feb. 10, 2022

(65) Prior Publication Data

US 2023/0378237 A1 Nov. 23, 2023

(30) Foreign Application Priority Data

Aug. 4, 2020 (GB) ...................................... 2012098
Aug. 4, 2020 (GB) ...................................... 2012103
(Continued)

(51) Int. Cl.
*H10H 29/14* (2025.01)
*H10H 20/01* (2025.01)
(Continued)

(52) U.S. Cl.
CPC ...... *H10H 29/142* (2025.01); *H10H 20/0137* (2025.01); *H10H 20/812* (2025.01);
(Continued)

(58) Field of Classification Search
CPC ............. H10H 29/142; H10H 20/0137; H10H 20/812; H10H 20/817; H01L 25/0753
See application file for complete search history.

(56) References Cited

U.S. PATENT DOCUMENTS 10,361,341 B2 7/2019 Danesh et al.
2005/0199883 A1 9/2005 Borghs et al.
(Continued)

FOREIGN PATENT DOCUMENTS

CN 106165125 A 11/2016
CN 107946417 A 4/2018
(Continued)

OTHER PUBLICATIONS

Pasayat, Shubhra S. et al., "Growth of strain-GaN on micrometer-sized patterned compliant relaxedInGaN", Applied Physics Letters, Jan. 16, 2020, vol. 116, No. 11, p. 1-5.
(Continued)

*Primary Examiner* — Ratisha Mehta
(74) *Attorney, Agent, or Firm* — Merchant & Gould P.C.

(57) ABSTRACT

A method of manufacturing an LED device comprises the steps of: providing a template comprising a first porous region of III-nitride material; forming a first LED structure on the template above the first porous region; and forming a second LED structure on the template, in which the second LED structure is not positioned above the first porous region. An LED device comprises a first LED structure, over a first porous region of III-nitride material; and a second LED structure which is not positioned over the first porous region. A three colour LED device is also provided.

30 Claims, 10 Drawing Sheets

(30) Foreign Application Priority Data

| | | |
|---|---|---|
| Aug. 4, 2020 | (GB) | 2012105 |
| Aug. 4, 2020 | (GB) | 2012108 |
| Aug. 4, 2020 | (GB) | 2012110 |
| Nov. 16, 2020 | (GB) | 2018016 |
| Jan. 22, 2021 | (WO) | PCT/GB2021/050147 |
| Jan. 22, 2021 | (WO) | PCT/GB2021/050152 |
| Jan. 22, 2021 | (WO) | PCT/GB2021/050158 |
| Feb. 12, 2021 | (GB) | 2102012 |
| Feb. 12, 2021 | (GB) | 2102017 |
| Feb. 12, 2021 | (GB) | 2102021 |

(51) Int. Cl.

| | |
|---|---|
| ***H10H 20/812*** | (2025.01) |
| ***H10H 20/817*** | (2025.01) |
| ***H10H 20/825*** | (2025.01) |
| ***H10W 90/00*** | (2026.01) |

(52) U.S. Cl.

CPC ...... *H10H 20/817* (2025.01); *H10H 20/8252* (2025.01); *H10W 90/00* (2026.01)

(56) References Cited

U.S. PATENT DOCUMENTS

| | | | |
|---|---|---|---|
| 2009/0001416 | A1 | 1/2009 | Chua et al. |
| 2009/0140274 | A1 | 6/2009 | Wierer, Jr. et al. |
| 2010/0051972 | A1 | 3/2010 | Chen et al. |
| 2010/0140629 | A1 | 6/2010 | Lee et al. |
| 2011/0193059 | A1 | 8/2011 | Wierer, Jr. et al. |
| 2013/0146842 | A1 | 6/2013 | Kim et al. |
| 2015/0125981 | A1 | 5/2015 | Ryu et al. |
| 2016/0197232 | A1 | 7/2016 | Bour et al. |
| 2017/0023724 | A1 | 1/2017 | Qin et al. |
| 2017/0237234 | A1 | 8/2017 | Han et al. |
| 2018/0332677 | A1 | 11/2018 | Ku et al. |
| 2019/0123235 | A1 | 4/2019 | Cho et al. |
| 2019/0214529 | A1 | 7/2019 | Ahmed |
| 2020/0152841 | A1 | 5/2020 | Han et al. |
| 2020/0227255 | A1 | 7/2020 | Zhu et al. |
| 2022/0190026 | A1* | 6/2022 | Levy ...................... H10H 20/01 |
| 2022/0208848 | A1 | 6/2022 | Tan et al. |
| 2022/0209066 | A1 | 6/2022 | Tan et al. |
| 2023/0051845 | A1* | 2/2023 | Zollner .................. H10H 29/14 |
| 2023/0085036 | A1 | 3/2023 | Mezouari et al. |
| 2023/0215906 | A1* | 7/2023 | Cheng .................. H10H 20/814 257/76 |
| 2024/0030275 | A1 | 1/2024 | Avramescu et al. |

FOREIGN PATENT DOCUMENTS

| | | | |
|---|---|---|---|
| CN | 109768135 | B | 6/2020 |
| DE | 102020128679 | A1 | 5/2022 |
| JP | H11-145513 | A | 5/1999 |
| JP | 2004-079933 | A | 3/2004 |
| JP | 2006-121037 | A | 5/2006 |
| JP | 2007-27298 | A | 2/2007 |
| JP | 2007-335879 | A | 12/2007 |
| JP | 2009-21361 | A | 1/2009 |
| JP | 2012-195529 | A | 10/2012 |
| JP | 2013-051437 | A | 3/2013 |
| JP | 2014-127708 | A | 7/2014 |
| JP | 2016-527706 | A | 9/2016 |
| JP | 2018-502436 | A | 1/2018 |
| JP | 2018-533847 | A | 11/2018 |
| JP | 2019-516251 | A | 6/2019 |
| KR | 10-1136063 | B1 | 4/2012 |
| TW | 201921716 | A | 6/2019 |
| WO | 2009/038324 | A2 | 3/2009 |
| WO | 2013/140320 | A1 | 9/2013 |
| WO | 2018/080860 | A1 | 5/2018 |
| WO | 2019/027820 | A1 | 2/2019 |
| WO | 2019/063957 | | 4/2019 |
| WO | 2019/145728 | | 8/2019 |

OTHER PUBLICATIONS

Zhao, S. et al., "Molecular Beam Epitaxy of III-Nitride Nanowires: Emerging Applications from Deep-Ultraviolet Light Emitters and Micro-LEDs to Artificial Photosynthesis", 03 IEEE Nanotechnology Magazine, Mar. 4, 2019, vol. 13, No. 2 p. 6-16.

Exam Report for European Patent Application No. 21752137.6 (Jan. 21, 2025).

Inatomi et al., "Theoretical study of the composition pulling effect in InGaN metalorganic vapor-phase epitaxy growth," Japanese Journal of Applied Physics, vol. 56, No. 7 (2017).

International Search Report and Written Opinion for PCT/GB2021/050147 (Apr. 9, 2021).

International Search Report and Written Opinion for IPCT/GB2021/050152 (Apr. 15, 2021).

International Search Report and Written Opinion for PCT/GB2021/050158 (Apr. 15, 2021).

International Search Report and Written Opinion for PCT/GB2021/052022 (Nov. 2, 2021).

International Search Report and Written Opinion for PCT/GB2021/052023 (Nov. 2, 2021).

Office Action for Japanese Patent Application No. 2022-544132 (Aug. 13, 2024).

International Search Report and Written Opinion of PCT/GB2021/052019, Nov. 2, 2021, 15 pages.

* cited by examiner

Figure 5
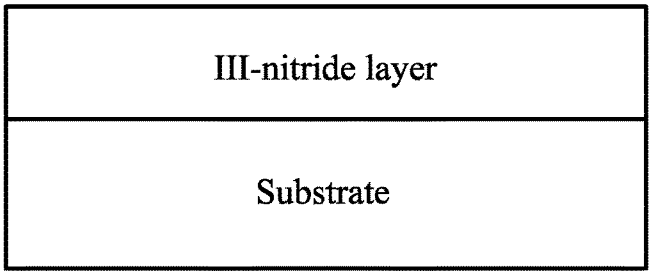
Figure 6
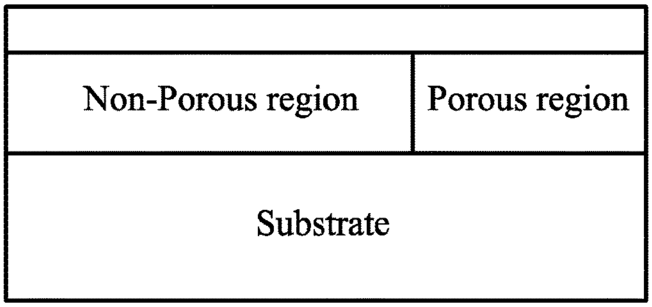
Figure 7
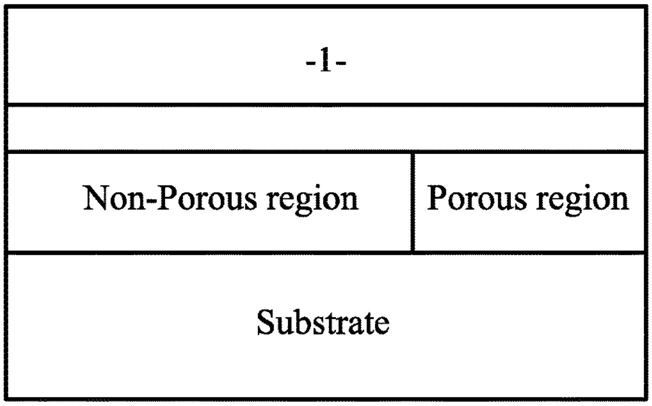
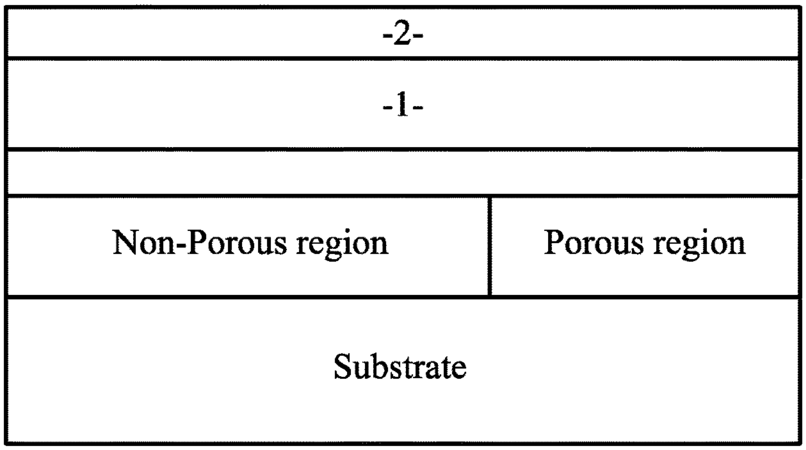
Figure 8

LED DEVICE AND METHOD OF MANUFACTURE

The present invention relates to semiconductor devices and a method of manufacture for semiconductor devices, in particular to LEDs devices, arrays of LED devices and an improved method of manufacturing LED devices.

BACKGROUND

Standard light-emitting diodes (LEDs) for light emission are normally larger than 200 μm×200 μm. Micro-LEDs are arrays of micro-scale LEDs with high density with lateral size down to less than 100 μm×100 μm. So a micro-LED may be defined as an LED structure with lateral dimensions (Length and width) smaller than 100 μm×100 μm all the way down to a few tens of nanometers or even smaller.

In the past, attempts have been made to manufacture micro-LEDs using known techniques. For example, prior attempts have used normal LED epitaxy and laser lift-off, electrostatic carry, and elastomer stamp for the transfer. However, there are problems with applying this approach to devices as small as micro-LEDs.

These problems include:

- Using normal LED epitaxy, it is challenging to generate all three main colours (RGB: red, green, blue) on the same chip of micro-LEDs.
- Efficiencies are low for green and red micro-LEDs.
- Dry etching is always needed to define micro-scale LED mesas. As LED sizes are smaller, plasma damage to the side wall of the LED structure will influence the emission efficiency and lifetime of the devices.
- Laser lift-off is low yield and costly.
- Transfer printing—low yield due to pre-existing strain/bow issues.

Due to these problems, conventional LED manufacture techniques are not satisfactory for the production of high quality micro-LEDs. In particular, conventional LED manufacture techniques are not satisfactory for the production of multi-colour LED devices comprising LEDs of multiple different colours on the same substrate.

SUMMARY OF INVENTION

The present application relates to an improved method of manufacturing LED devices, and to LED devices made using that method. The present invention is defined in the independent claims, to which reference should now be made. Preferred or advantageous features of the invention are set out in the dependent sub-claims.

The LED device is preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "μl-nitride" materials, which includes gallium nitride (GaN), indium nitride (InN) and aluminium nitride (AlN), along with their ternary and quaternary alloys. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties, for example its refractive index. The possibility of tuning the optical properties of GaN by altering its porosity therefore makes porous GaN of great interest for optoelectronic applications.

The present invention will be described by reference to GaN but may advantageously be applicable to alternative III-nitride materials.

Prior publications relating to the porosification of III-V semiconductor material include international patent applications PCT/GB2017/052895 (published as WO2019/063957) and PCT/GB2019/050213 (published as WO2019/145728).

The inventors have found that multi-coloured LED devices and arrays of multi-coloured LED devices can advantageously be provided using the present invention.

Method of Manufacturing an LED Device

According to a first aspect of the present invention there is provided a method of manufacturing an LED device, the method comprising the steps of: providing a template comprising a first porous region of III-nitride material;

- forming a first LED structure on the template above the first porous region; and
- forming a second LED structure on the template, in which the second LED structure is not positioned above the first porous region.

The template preferably comprises a substrate, and the first porous region of III-nitride material positioned above the substrate.

The first LED structure is configured to emit light at a first emission wavelength under an electrical bias applied across the LED structure. The second LED structure is preferably configured to emit light at a second emission wavelength different from the first emission wavelength under an electrical bias applied across the second LED structure.

By forming a first LED structure configured to emit light at a first emission wavelength, and a second LED structure configured to emit light at a second emission wavelength, on the same template, a multi-colour LED device is provided. Both first and second LED structures emit at different wavelengths, though they are provided on the same porous template.

The first LED structure and the second LED structure may be configured to emit light at a variety of wavelengths. For example, the first LED structure may be a green-emission LED structure, or a blue-emission LED structure, or a red-emission LED structure. The second LED structure may also be a green-emission LED structure, or a blue-emission LED structure, or a red-emission LED structure, but is configured to emit at a different colour than the first LED structure.

In preferred embodiments, the first LED structure is configured to emit light at a first emission wavelength of between 515 nm and 540 nm, preferably around 530 nm, when the LED structure is under electrical bias, and the second LED structure is configured to emit light at a second emission wavelength of between 570 nm and 630 nm, preferably a wavelength greater than 600 nm, when the LED structure is under electrical bias.

The LED device is preferably a laminar structure formed from a stack of flat layers of semiconductor material. The thicknesses, compositions and charge carrier concentrations in each layer of the structure may be controlled during epitaxial deposition of each layer or region of the structure. As the device is formed by sequential deposition of layers, subsequent layers are deposited over the top of earlier layers, so that they are positioned above the earlier layers in the resulting structure. Such devices are typically deposited as very thin layers on flat substrates, such that the lateral width of the layers are far greater than their height. By controlling the order in which layers are deposited, and controlling the lateral size and position of each layer relative to the layers below, the relative positions of the device components may be controlled. Except where indicated otherwise, a layer or region described herein as being formed or positioned "over" or "above" another layer is located both vertically above the other layer in the semiconductor structure, and extends laterally over an area which corresponds to an area of at least a portion of the other layer in the structure below.

In a first embodiment, the template may comprise a second porous region of III-nitride material positioned on the substrate in the same plane as the first porous region, and the method may comprise the step of forming the second LED structure above the second porous region of the template. The first porous region of III-nitride material may have a first porosity, and the second porous region of III-nitride material preferably has a second porosity different from the first porosity.

In preferred embodiments, the template may also comprise a third porous region of III-nitride material in the same plane as the first porous region and the second porous region, and the method may comprise the step of forming a third LED structure above the third porous region of the template.

In other preferred embodiments, the template comprises a non-porous region of III-nitride material in the same plane as the first porous region. The porous region and the non-porous region may preferably be disposed in the same plane on the substrate, for example a layer of the structure may be made up partially of porous III-nitride material, and partially of non-porous material, with these regions covering different lateral areas of the substrate.

The method may comprise forming the second LED structure above the non-porous region of the template. Thus the first LED structure may be positioned over a porous region of the template, while the second LED structure is not positioned over a porous region.

The present inventors have realised that electrochemical porosification of III-nitride materials advantageously leads to a reduction in the strain in the III-nitride lattice, and a reduction in the overall wafer bow or curvature. Without wishing to be bound by theory, it is thought that the process of porosifying the porous region of III-nitride material also etches away structural defects, such as threading dislocations which were formed during growth of that layer on top of the layer of first III-nitride material.

The removal of dislocations from the semiconductor material of the porous region during porosification greatly reduces the strain in the porous region, which occurs particularly if the lattice dimension of the porous region does not match the lattice dimension of the underlying material. Thus, during epitaxial growth of the semiconductor structure when layers of III-nitride material are deposited above the porous region, the porous material is more compliant to matching the lattice of the overlying non-porous layers. This results in the layers above the porous region experiencing significantly lower strain than would be the case without the porous region.

Composition pulling effect: Kawaguchi et al. reported a so-called InGaN composition pulling effect in which the indium fraction is smaller during the initial stages of growth but increases with increasing growth thickness. This observation was to a first extent independent of the underlying layer, GaN or AlGaN. The authors suggested that this effect is caused by strain caused by the lattice mismatch at the interface. They found that a larger lattice mismatch between InGaN and the bottom epitaxial layers was accompanied by a larger change in the In content.

In Theoretical study of the composition pulling effect in InGaN metalorganic vapor-phase epitaxy growth by Inatomi et al (Japanese Journal of Applied Physics, Volume 56, Number 7) it was found that compressive strain suppresses the incorporation of InN. On the other hand, tensile strain promotes the incorporation of InN compared to the relaxed bulk growth case.

The inventors have found that the use of a porous region in the semiconductor structure leads to "strain relaxation" which reduces strain in the layers of a semiconductor structure, and that this can lead to an improvement with respect to the composition pulling effect. Porosification reduces the strain in the III-nitride layers and the semiconductor structure is made less strained, and thus the conditions for higher incorporation of In are made available. The present invention can therefore aid in higher Indium incorporation into layers of any LED structure grown over a porous region of the template, which is highly desirable for emission at longer wavelengths.

By providing a porous region of III-nitride material in the template, one or more of the LED structures may therefore be grown over the porous region with a lower strain than would be possible without the porous region. This reduced level of strain in the layered semiconductor structure can therefore aid in higher Indium incorporation into the light emitting layer(s) of the LED, so that high quality InGaN light emitting layers can be grown with a high Indium content. This allows enough indium to be incorporated into the light-emitting indium gallium nitride layer so that the LED emits light at a peak wavelength between 600 and 750 nm when an electrical bias is applied across the LED.

There is a huge demand for red LEDs that emit light between 600 and 750 nm, the technical difficulties of incorporating enough indium into the light emitting layer(s) has meant red InGaN LEDs have been hard to achieve. Shorter-wavelength LEDs such as green (500-550 nm) and yellow (550-600 nm) LEDs, however, are much easier to manufacture, as they can be made using InGaN light emitting regions containing a lower proportion of Indium than is needed for red light emission.

The inventors have found that growing an LED structure over a porous region of III-nitride material causes a significant shift in emission wavelength towards longer wavelengths, compared to an identical LED structure grown on a non-porous substrate.

The inventors have demonstrated this by growing a conventional green/yellow (emission between 500-550 nm, or 550 nm-600 nm) InGaN LED structure on a non-porous GaN wafer, and demonstrating that the LED emits green/yellow light as expected. The same "green/yellow" InGaN LED structure was then grown on a template containing a porous region, and when an electrical bias was applied across the LED the LED emitted light in the red range of between 600 and 750 nm.

In a preferred embodiment, the present invention may comprise a first LED structure green/yellow (emission between 500-550 nm, or 550 nm-600 nm) InGaN LED structure formed over the first porous region, and a second LED structure green/yellow (emission between 500-550 nm, or 550 nm-600 nm) InGaN LED structure formed over a non-porous region. The first LED structure and the second LED structure may have identical structures and compositions. Nevertheless, the position of the first LED structure over the first porous region will shift the emission wavelength of the first LED structure so that it emits light at a different wavelength than the second LED structure. The second LED structure may emit light at green/yellow wavelengths (emission between 500-550 nm, or 550 nm-600 nm) as expected, while the first LED structure emits light at a longer wavelength of 600-650 nm. Multiple colours of emission may therefore be achieved simply by forming the same conventional LED structure twice—once over a non-porous region, and once over a first porous region.

The same effect may be obtained by forming the first and second LED structures over respective porous regions having different porosities. As the porosity of the underlying III-nitride porous regions is related to the strain relaxation of the overgrown LED structures, porous regions having different % porosities thus create different degrees of strain relaxation, and therefore different degrees of wavelength shifts, in the LED structures grown on the template. Thus multiple colours of emission may be achieved by forming the same conventional LED structure twice—once over a first porous region having a first porosity, and once over a second porous region having a different second porosity.

The method of manufacturing an LED device may comprise a first step of electrochemically porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728). This step should be carried out prior to forming the LED structures.

The method may preferably comprise the step of forming the porous region of III-nitride material by electrochemical porosification through a non-porous layer of III-nitride material, such that the non-porous layer of III-nitride material forms a non-porous intermediate layer. The non-porous intermediate layer may advantageously provide a smooth surface for overgrowth of the LED structures, following which the intermediate layer is positioned between the porous region and the LED structures.

The porous region may be formed by porosifying one or more layers or regions of III-nitride material on the substrate. In order for the III-nitride material to be porosifiable, the material to be porosified should be n-type doped and have a doping concentration in the range of $1\times10^{17}$ to $1\times10^{20}$.

The substrate may be Silicon, Sapphire, SiC, β-Ga2O3. The crystal orientation of the substrates can be polar, semi-polar or non-polar orientation. The substrate thickness may typically vary between 100 μm and 1500 μm.

The porous region may be a porous layer, such that the method comprises the step of forming an n-doped connecting layer of III-nitride material over a porous layer of III-nitride material. Preferably the porous region may be a porous layer that is uniformly porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The n-doped connecting layer of III-nitride material may be formed over a porous region comprising a stack of porous layers of III-nitride material.

Alternatively the template may contain one or more porous regions, for example one or more porous regions in an otherwise non-porous layer of III-nitride material. This may be provided by depositing n-doped III-nitride material on only a pre-determined region of the substrate, and forming the rest of the layer from undoped III-nitride material that will not be electrochemically porosified.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 $cm^2$, or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around 1/10 of a pixel (for example 0.1 μm), up to the lateral dimensions of the substrate itself.

A layer, or a stack of layers, of n-doped III-nitride semiconductor material is grown on the substrate. The III-nitride layer may contain one or a combination of these elements: Al, Ga, In (ternary of quaternary layer). The thickness of the III-nitride stack is preferably between 10-4000 nm. The III-nitride layer to be porosified may have a doping concentration between $1\times10^{17}$ $cm^{-3}$-$5\times10^{20}$ $cm^{-3}$.

Preferably an intermediate layer of undoped III-nitride material is deposited over the doped material before it is porosified. The intermediate layer preferably have a thickness of between 1 nm and 3000 nm, preferably between 5 nm and 2000 nm, or between 1000 nm and 1500 nm.

As is known in the art, electrochemical porosification removes material from n-type doped regions of III-nitride materials, and creates empty pores in the semiconductor material.

In preferred embodiments, prior to porosification the doped region consists of an alternating stack of layers that are in a sequence of highly-doped layer/low-doped layer. The stack may consist of high/low doping layer pairs, preferably wherein the stack contains between 5-50 pairs of layers. The thickness of each highly-doped layer may for example vary between 10 nm and 200 nm, or between 20 nm and 150 nm, or between 50 nm and 100 nm. Low-doped layers may for example have a thickness of between 5 nm and 180 nm, or between 20 nm and 150 nm, or between 50 nm and 100 nm.

The stack of porous layers may preferably be a stack of alternating porous and non-porous layers. Preferably the stack comprises between 5 and 50 pairs of porous and non-porous layers, stacked one on top of another. The porous layers may preferably have a thickness of between 10 nm and 200 nm, or between 20 nm and 150 nm, or between 50 nm and 100 nm. The non-porous layers may preferably have a thickness of between 5 nm and 180 nm, or between 20 nm and 150 nm, or between 50 nm and 100 nm.

In preferred embodiments, the porous region may comprise a stack of multiple porous layers of III-nitride material. Thus, rather than being a single porous layer of III-nitride material, the porous region may be a stack of layers of III-nitride material in which at least some layers are porous.

The porous region, or each porous layer in the porous region, may have a porosity of between 1% and 99% porous. Preferably the porous region, or each porous layer in the stack, has a porosity of between 10% and 90% porosity, or between 10% and 70% porosity.

The template may comprise an n-doped connecting layer of III-nitride material over the first porous region of III-nitride material. Preferably the n-doped connecting layer of III-nitride material is positioned over the non-porous intermediate layer.

The LED structures may be formed on the n-doped connecting layer.

The n-type connecting layer may advantageously act as a current spreading layer to provide current to both the first and second LED structures. Providing multiple LED structures in contact with the same conductive connecting layer also means that electrical n-contact can be made very easily with both LED structures.

The method may comprise the step of forming an electrically-insulating (dielectric) mask layer, and then removing a portion of the mask to expose an exposed region of the n-doped connecting layer, which creates a template or "footprint" on which the LED structures may be formed. The size and shape of the exposed regions may be controlled by controlling the size and shape of the portion of the mask that is removed. Subsequent layers of semiconductor material may then be deposited onto the exposed regions to form the first and second LED structures respectively. By controlling the size and shape of the exposed regions, the lateral size (length and width) and shape of the subsequently-formed LED structures may be controlled. This size control is particularly advantageous for growing micro-LED structures with extremely small lateral dimensions.

The thickness of the non-porous intermediate layer may optionally be reduced by etching prior to the growth of the LED structures.

The n-doped connecting layer of III-nitride material preferably has a thickness of between 200 nm and 2000 nm. The n-doped connecting layer of III-nitride material may preferably have an n-type charge carrier concentration between $1\times10^{17}\ cm^{-3}$-$5\times10^{20}\ cm^{-3}$, preferably a charge carrier concentration of at least $1\times10^{18}\ cm^{-3}$.

The template preferably comprises a non-porous intermediate layer of III-nitride material above the first porous region, or above the layer containing the first porous region. Preferably the non-porous intermediate layer is a parallel-sided flat layer that extends over the first porous region and also any other non-porous region and/or other porous regions that are positioned in the plane of the first porous region. Preferably the first and second LED structures are formed on the non-porous intermediate layer.

The steps of forming the first LED structure and the second LED structure may comprise growing LED structures according to conventional methods in the art. That is, the LED structures may be grown using known semiconductor deposition techniques and may have a variety of conventional LED epitaxial layers. While exemplary LED structures will be described herein by way of example, a large variety of LED structures (including various combinations of layer thicknesses, materials and doping levels) are known in the art and will be understood by the skilled person to be usable with the present invention. In the present invention, however, the first and second LED structures are respectively formed, grown or deposited only on the first and second exposed region(s) of the n-doped connecting layer.

The step of forming the first LED structure may comprise forming on the template, above the first porous region of III-nitride material:

a first n-doped portion;

a first p-doped portion; and a first light emitting region located between the first n-doped portion and the first p-doped portion.

The step of forming the second LED structure may comprise forming on the template:

a second n-doped portion;

a second p-doped portion; and a second light emitting region located between the second n-doped portion and the second p-doped portion.

The first and second LED structures may optionally be formed one after the other, by masking a portion of the template, growing one of the LED structures, and then masking the LED structure and exposing the previously-masked portion of the template before growing the other LED structure.

The method may comprise the steps of:

forming a first electrically-insulating mask over the first porous region;

forming a second LED structure on an unmasked region of the template;

forming a second electrically-insulating mask over the second LED structure;

exposing the first porous region; and forming the first LED structure on the first porous region.

A variety of first and second LED structures may be grown on the template while obtaining the benefit of the present invention. All such LED structures typically comprise an n-doped portion, a light-emitting region and a p-doped portion, and optionally further layers of semiconductor material that are typical in LED epitaxy.

Alternatively, the steps of forming a first LED structure and a second LED structure may comprise:

forming an LED structure over the template, the LED structure comprising an n-doped portion;

a p-doped portion; and a light emitting region located between the n-doped portion and the p-doped portion; and dividing the LED structure into a plurality of LED structures, to form a first LED structure above the first porous region and a second LED structure that is not positioned above the first porous region.

In other words, a large-scale LED structure may be formed over the whole template, and then divided into mesas forming individual first and second LED structures, preferably micro-LED structures. Each first and second LED structure would then have the same layer design, with the thicknesses and the compositions of the semiconductor layers being the same in each LED structure. If this is the case, then the emission wavelength of any given LED structure may be determined by whether or not the given LED structure is positioned over a porous region of III-nitride material, and therefore benefiting from the strain relaxation and resulting wavelength shift.

Exemplary LED structures suitable for use as a first and/or second LED structure in the present invention are described below.

The first and second, and optionally third, LED structures may be formed in any sequence.

In a preferred embodiment, the n-doped portion of each LED structure is grown on the connecting layer, so that the n-doped portion is in direct contact with the n-doped connecting layer.

The n-doped portion may comprise an n-doped layer of III-nitride material. The n-doped layer may comprise a III-nitride layer containing indium, or a stack of thin III-nitride layers with or without indium, or a bulk layer or stack of III-nitride layers with a variation in atomic percentage of indium across the layer or stack. For example, the n-doped region may be a layer of n-GaN, or a layer of n-InGaN, or alternatively the n-doped region may be a stack of n-GaN/n-InGaN alternating layers, or a stack of n-InGaN/n-InGaN alternating layers having different quantities of indium in alternating layers.

The Indium atomic percentage in the n-doped portion may vary between 0.5-25%. The total thickness of the n-doped portion may vary between 2 nm-200 nm, for example between 10 nm and 150 nm, or between 20 nm and 100 nm. If the n-doped portion comprises a stack of layers, then the thickness of each individual layer in the stack may preferably vary between 1 nm and 40 nm, or between 5 nm and 30 nm.

The n-doped portion may have an n-type doping concentration between $1\times10^{17}$ $cm^{-3}$-$5\times10^{20}$ $cm^{-3}$.

After growth of the n-doped portion of the LED structure on the template, the light-emitting region of the LED is overgrown on the n-type portion.

The light-emitting region in the first and/or second LED structures may comprise one or more III-nitride light-emitting layers, preferably indium gallium nitride (InGaN) light-emitting layers. The light-emitting layer or each light-emitting layer preferably comprises a quantum well, or a nanostructured layer comprising quantum structures such as quantum dots, fragmented or discontinuous quantum wells.

The quantum wells and barriers are preferably grown in a temperature range of 600-800° C., according to known techniques.

The light-emitting layer or each light-emitting layer preferably comprises a III-nitride material with an atomic indium content of between 10-30%. The indium content of the light-emitting layers may be selected at different levels depending on the emission wavelength that is desired for the first and second LED structures. In preferred embodiments the light-emitting layer may have an indium content of between 20-30%, preferably above 22%.

The light emitting region may comprise one or more light-emitting layers which have the composition $In_xGa_{1-x}N$, in which $0.10\leq x\leq0.30$, preferably $0.18\leq x\leq0.30$, particularly preferably $0.20\leq x\leq0.30$. Preferably the LED structure is a green-emitting LED structure.

In a preferred embodiment, the target electroluminescence (EL) emission wavelength of the LED structure under electrical bias thereacross may be between 500 nm-560 nm, preferably 515 nm-540 nm or 520 nm to 540 nm, preferably 530 nm.

In preferred embodiments, each light-emitting region comprises one or more InGaN quantum wells, preferably between 1 and 7 quantum wells. The thickness of each quantum well layer may vary between 1.5-8 nm.

The quantum wells may or may not be capped with a thin (0.5-3 nm) Ill-nitride layer.

The III-nitride barrier layer may contain one or a combination of these elements: Al, Ga, In (ternary or quaternary layer).

The quantum wells and barriers of the light-emitting region are preferably grown in a temperature range of 600-800° C.

The LED structure may comprise a cap layer of III-nitride material between the quantum wells and the p-doped portion, preferably in which the cap layer is undoped and has a thickness of between 5 nm and 30 nm.

The p-doped portions of the LED structure is overgrown above the light-emitting regions, and comprises a p-doped III-nitride layer and a p-doped aluminium gallium nitride layer positioned between the p-doped III-nitride layer and the light emitting region. The p-doped aluminium gallium nitride layer is an electron-blocking-layer (EBL) between the cap layer and the p-type layer, in which the electron-blocking-layer contains 5-25 at % aluminium, preferably in which the electron-blocking-layer has a thickness of between 10 nm and 100 nm, or between 20 nm and 50 nm.

The p-doped III-nitride layer preferably has a p-type doping concentration of between $5\times10^{18}$ $cm^{-3}$-$8\times10^{20}$ $cm^{-3}$. The p-doped III-nitride layer may contain In and Ga, and may be between 20-200 nm thick, preferably between 50-100 nm thick. The doping concentration may vary across this layer and can have a spike in doping levels in the last 10-30 nm of the layer. For activation of Mg acceptors, the structure may be annealed inside of MOCVD reactor or in an annealing oven. The annealing temperature may be in the range of 700-850° C. in N2 or in N2/O2 ambient.

As both the EBL and the p-doped layer are p-type doped, these layers may be referred to as the p-doped portion.

The method may comprise the further step of, after the second LED structure has been formed, removing a portion of the second mask to expose a region of the first LED structure; and forming an electrical contact in the exposed region of the first LED structure, preferably forming an electrical connection with the p-doped portion of the first LED structure. An electrical connection may also be formed with the p-doped portion of the second LED structure. Portions of the passivation layer and the dielectric mask layer may be removed by wet etching, dry etching, or a combination of both. For wet etching, buffered oxide etch, diluted hydrofluoric acid, phosphoric acid or a mixture of these can be used.

Forming a p-doped portion electrical connection may comprise the step of depositing transparent conducting oxide (e.g ITO, ZnO on other compatible oxides) or metal layers on the p-type region of the first and second LED structures. The covering can be done with a single step or multiple steps. The metals can cover the p-type regions completely or partially. The metal may contain Ti, Pt, Pd, Rh, Ni, Au, Ag etc. The thickness of the complete metal stack can be between 200 nm and 2000 nm, or between 500 nm and 1000 nm.

The structuring can be done be using standard semiconductor processing methods that included resist coating, photolithography and lift off. This can be combined with dry or wet structuring so that the conducting metal layer fully or only partially covers the top surface of the p-doped regions.

The method preferably comprises the step of, after the electrical connection has been formed with the p-doped portion, exposing a region of the n-type connecting layer and forming an electrical contact with the n-type connecting layer. A region of the n-type connecting layer is preferably exposed by removing a portion of the second mask layer. Standard photolithography techniques can be used to create openings in the second mask layer. The size of the openings can vary between 200 nm and 50000 nm. This distance between the openings can be between 500 nm-30000 nm. The openings are creating only in the areas of the device that do not have any LED structure. Dry etching may be used to etch the passivation layer using fluorine based gases.

Forming an n-doped portion electrical connection may comprise the step of depositing a metal contact on the exposed region of the n-type connecting layer, preferably by depositing metal in the opening created in the second mask layer. The covering can be done with a single step or multiple steps. The metal may contain Ti, Pt, Pd, Rh, Ni, Au, Ag etc. The thickness of the metal stack contact can be between 200 nm and 2000 nm for example, or between 500 nm and 1000 nm.

The method may comprise the step of forming an electrically-insulating mask over at least one of the LED structures; and electrochemically porosifying the light-emitting region of the uncovered LED structure.

Third LED Structure

The method of the present invention may advantageously be used to provide an LED device with three different emission wavelengths, by forming a third LED structure on the template, preferably on the n-doped connecting layer. The third LED structure is preferably not positioned above the first porous region. The third LED structure may be configured to emit light at a third emission wavelength different from the first and second emission wavelengths.

The third LED structure may be formed on the template so that it is positioned above a third porous region, or alternatively the third LED structure may be positioned over a non-porous region of the template.

Preferably the method comprises the step of electrochemically porosifying the light-emitting region of the third LED structure.

In one preferred embodiment, the third LED structure may be formed simultaneously with the first LED structure and/or the second LED structure. Thus the third LED structure may have the same structure as the first LED structure and/or the second LED structure.

In another preferred embodiment, after forming the first and second LED structures on the template, the LED structures may be passivated by covering them in a mask layer of dielectric material. A portion of the third mask layer, and any underlying mask layers, may then be removed to expose a third exposed region of the template. A third LED structure, configured to emit light at a third wavelength different from the first and second wavelengths, may then be formed on the third exposed region.

The third LED structure may be an LED structure as described above, which is configured to emit wavelength at a different wavelength from the first and second LED structures. In a particularly preferred embodiment, the LED device may comprise one red-, one green- and one blue-emitting LED structure.

Particularly preferably, one of the first, second or third LED structures emits red light under electrical bias thereacross; one of the first, second or third LED structures emits green light under electrical bias thereacross; and one of the first, second or third LED structures emits blue light under electrical bias thereacross.

The third LED structure may be a conventional LED structure configured to emit light of a known wavelength under an applied electrical bias. In a preferred embodiment, the third LED structure may be emit blue light under an electrical bias. Particularly preferably, the third LED may be a blue LED formed by the process described in WO2019/145728. For example, the blue LED may be formed by electrochemically porosifying the light-emitting quantum well layers in the as-grown third LED structure. As described in WO2019/145728, porosifying the quantum well layers results in a blue-shift in the emission spectrum of the LED structure.

In one preferred embodiment, the method may comprise the steps of:

- forming an LED structure over the template;
- forming a mask over the LED structure;
- exposing an exposed region of the LED structure; and
- electrochemically porosifying the light-emitting region beneath the exposed region to form a porous portion of the light-emitting region of the LED structure.

The method may then comprise the step of dividing the LED structure to form a first LED structure above the first porous region, a second LED structure not above the first porous region and a third LED structure containing the porous portion of the light-emitting region.

Manufacturing an Array of Micro-LEDs

According to a second aspect of the present invention there is provided a method of manufacturing an array of LEDs, comprising the steps of:

- providing a template comprising a first porous region of III-nitride material; forming an array of first LED structures on the template above the first porous region; and forming an array of second LED structures on the template, in which the second LED structures are not positioned above the first porous region.

The method of manufacturing an array of LEDs preferably comprises the method of the first aspect. As described above, the first and second LED structures may be formed by forming an LED structure on the template, and then dividing the LED structure into a plurality of LED structures, for example by etching channels into the LED structure.

Preferably the LED structures may be micro-LED structures.

The arrays of LED structures are preferably uniform arrangements or patterns of identical LED structures. For example, the arrays may comprise multiple rows and columns of regularly-spaced first and second LED structures, respectively.

The method may comprise the step of forming an array of third LED structures on the template, in which the third LED structures are not positioned above the first porous region.

The array of LEDs may advantageously be formed on a single substrate. The arrays of LED structures may be formed simultaneously, using deposition steps which deposit layers of semiconductor material on each exposed region of the connecting layer at the same time.

The method of the second aspect may advantageously include any and all of the features described above in relation to the first aspect of the invention.

Method of Manufacturing a Three Colour LED Device

According to a third aspect of the present invention there is provided a method of manufacturing a three colour LED device, comprising the steps of:

- forming a first LED structure, which is configured to emit light at a first emission wavelength, over a first porous region of III-nitride material on a template;
- forming a second LED structure, which is configured to emit light at a second emission wavelength, on the template, the second LED structure not being positioned over the first porous region;
- forming a third LED structure, which is configured to emit light at a third emission wavelength, on the template, the third LED structure not being positioned over the first porous region.

As the three LED structures emit light at three different emission wavelengths in response to electrical bias applied across the LED structures, the device is a three-colour LED device.

In a particularly preferred embodiment, the first, second and third emission wavelengths are red, green and blue. The three-colour LED device may therefore be a red-green-blue (RGB) LED device.

In a preferred embodiment, the second LED structure and the third LED structure are identical to the first LED structure, and the first, second and third LED structures are formed simultaneously. In this embodiment, the different first and second emission wavelengths of the first and second LED structures is caused by a wavelength shift created by the porous region that is underlying the first LED structure, but not the second LED structure. For example, both the first and second LED structures may be conventional green LED structures (that is, LED structures known to emit green light under an applied electrical bias). Due to the porous region causing a wavelength shift in the present invention, however, the first LED structure in the three-colour LED device may advantageously emit red light under an applied electrical bias, while the second LED structure emits green light as expected.

The step of forming the third LED structure may comprise the step of electrochemically porosifying one or more light-emitting layers in the third LED structure. As described above, and as described in WO2019/145728, porosifying the quantum well layers results in a blue-shift in the emission spectrum of the LED structure.

The second LED structure may be formed above a non-porous region of III-nitride material on the template, or alternatively the second LED structure may be formed above a second porous region of III-nitride material on the template, the second porous region having a porosity different from the first porous region.

The third LED structure is preferably formed above a non-porous region of III-nitride material on the template, or alternatively the third LED structure may be formed above a third porous region of III-nitride material on the template, the third porous region having a porosity different from the first porous region.

LED Device

Another aspect of the invention relates to an LED device, which may be a an LED device or a micro-LED device made by the method set out above.

According to a fourth aspect of the present invention there is provided an LED device, comprising:

a first LED structure, over a first porous region of III-nitride material; and a second LED structure which is not positioned over the first porous region.

The first LED structure is preferably configured to emit light at a first emission wavelength, and the second LED structure is preferably configured to emit light at a second emission wavelength different from the first emission wavelength.

The second LED structure may be positioned over a second porous region of III-nitride material, the second porous region having a different porosity from the first porous region. Alternatively, the second LED structure may be positioned over a non-porous region of III-nitride material, the non-porous region of III-nitride material being arranged in the same plane as the first porous region.

The LED device is preferably an LED device manufactured using the method described above in relation to the first aspect of the invention. The LED device comprises two LED structures that emit at different wavelengths, and so may be termed a multi-colour LED, a multi-colour LED device, or a multi-wavelength LED device.

The LED device preferably comprises a non-porous intermediate layer of III-nitride material positioned between the first porous region and the first LED structure. The LED device preferably further comprises an n-doped connecting layer positioned between the non-porous intermediate layer of III-nitride material and the LED structures.

As described above, the n-doped connecting layer of III-nitride material may extend over multiple porous regions of III-nitride material, or the connecting layer may extend over the first porous region of III-nitride material and a non-porous region of III-nitride material, the porous region and non-porous region being disposed in the same plane as one another.

The first and/or second and/or third porous region may be a porous layer, such that the LED device comprises an n-doped connecting layer of III-nitride material over a porous layer of III-nitride material. In some embodiments, the porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The n-doped connecting layer of III-nitride material may be formed over a porous region comprising a stack of porous layers of III-nitride material.

In preferred embodiments, the porous region(s) comprises a stack of multiple porous layers of III-nitride material. Thus, rather than being a single porous layer of III-nitride material, the or each porous region may be a stack of layers of III-nitride material in which at least some layers are porous.

The stack of porous layers may preferably be a stack of alternating porous and non-porous layers. Preferably the stack comprises between 5 and 50 pairs of porous and non-porous layers, stacked one on top of another. The porous layers may preferably have a thickness of between 10 nm and 200 nm, and the non-porous layers may preferably have a thickness of between 5 nm and 180 nm.

Preferably the porous region, or each porous layer in the stack, has a porosity of between 10% and 90% porosity, or between 20% and 70% porosity.

The LED device may comprise an intermediate layer of non-porous III-nitride material positioned between the porous region and the LED structures. The intermediate layer preferably has a thickness of between 1 nm and 3000 nm, preferably between 20 nm and 2000 nm, or between 50 nm and 1000 nm.

The LED preferably comprises an n-doped connecting layer of III-nitride material between the intermediate layer and the LED structures. The connecting layer preferably has a thickness of between 100 nm and 2000 nm, or between 200 nm and 1000 nm. The n-doped connecting layer of III-nitride material may have a doping concentration between $1\times10^{17}$ $cm^{-3}$-$5\times10^{20}$ $cm^{-3}$ and preferably has an n-type charge carrier concentration of at least $1\times10^{18}$ $cm^{-3}$.

At least a portion of each LED structure is preferably in contact with the n-doped connecting layer. Preferably the n-doped portion of each LED structure is in electrical contact with the n-doped connecting layer.

The first LED structure may comprise:

a first n-doped portion;

the first p-doped portion; and a first light emitting region located between the first n-doped portion and the first p-doped portion, and the second LED structure may comprise:

a second n-doped portion;

a second p-doped portion; and a second light emitting region located between the second n-doped portion and the second p-doped portion.

The first and/or second n-doped portion may comprise an n-doped III-nitride layer, preferably in which the n-doped portion comprises n-GaN, or n-InGaN, or a stack of alternating layers of n-GaN/n-InGaN, or a stack of alternating layers of n-InGaN/n-InGaN containing different concentrations of indium.

The first and/or second light-emitting region may comprise one or more III-nitride light-emitting layers, and the or each light-emitting layer may comprise a quantum well, or a nanostructured layer comprising quantum structures such as quantum dots, fragmented or discontinuous quantum wells.

Preferably the one or more light-emitting layers in the LED structures have the composition $In_xGa_{1-x}N$, in which $0.10 \le x \le 0.30$, preferably $0.18 \le x \le 0.30$, particularly preferably $0.20 \le x \le 0.30$.

In a preferred embodiment, the second LED structure is identical to the first LED structure, and the first and second LED structures emit light at different emission wavelengths due to the porous region beneath the first LED structure.

As explained above in relation to the first aspect of the invention, the LED structure may take a variety of different forms having layers of different thickness, composition and charge carrier concentration.

The features of the LED device described above in relation to the first aspect of the invention apply equally to the LED device of the third aspect.

The first and/or second LED structures may comprise an active layer which may be a Quantum Well, or a Quantum layer (for example a porosified Quantum Well containing a plurality of 3D quantum structures). The Quantum Well could be InGaN, AlGaN, InN, InAlN, AlInGaN, while the quantum barrier surrounding the quantum well layer could be GaN, AlN, AlGaN, AlInGaN, InAlN.

The LED structures may have lateral dimensions (Length and width) smaller than 100 μm×100 μm all the way down to a few tens of nanometers or even smaller. In this context, the "height" of the LED is the dimension in the direction of intended light emission.

The light-emitting regions preferably comprise one or more InGaN quantum wells, particularly preferably between 1 and 7 quantum wells.

The LED device may optionally comprise further LED structures configured to emit light at wavelengths different from the first and second wavelengths. For example. The LED device may additionally comprise a third LED structure, a portion of which extends through a gap in the electrically-insulating mask layer, and is in contact with the n-doped connecting layer.

In a preferred embodiment, the LED device additionally comprises a third LED structure formed over the non-porous region of III-nitride material. Alternatively, the LED device additionally may comprise a third porous region of III-nitride material having a third porosity, and a third LED structure on the third porous region.

The third LED structure is preferably configured to emit light at a third emission wavelength different from the first and second emission wavelengths. Preferably the one or more light-emitting layers in the third LED structure have the composition $In_zGa_{1-z}N$, in which $0.10 \le z \le 0.40$, preferably $0.10 \le z \le 0.30$, particularly preferably $0.15 \le z \le 0.25$.

In a particularly preferred embodiment, the one or more light-emitting layers in the third LED structure are porous.

Particularly preferably the first, second and third LED structures are configured so that:

- one of the first, second or third LED structures emits light at peak wavelengths between 600 and 750 nm under electrical bias thereacross;
- one of the first, second or third LED structures emits light at peak wavelengths between 515 and 550 nm under electrical bias thereacross; and
- one of the first, second or third LED structures emits light at peak wavelengths between 415 and 500 nm under electrical bias thereacross.

Preferably one of the first, second or third LED structures emits red light under electrical bias thereacross; one of the first, second or third LED structures emits green light under electrical bias thereacross; and one of the first, second or third LED structures emits blue light under electrical bias thereacross. Particularly preferably the first LED structure emits red light under electrical bias thereacross; the second LED structure emits green light under electrical bias thereacross; and the third LED structure emits blue light under electrical bias thereacross.

Array of LEDs

According to a fifth aspect of the present invention there is provided an array of LEDs. The array of LEDs may comprise a plurality of LED devices according to the fourth aspect of the invention, formed on a shared substrate, such as a single semiconductor wafer.

An array of LEDs is an ordered series or arrangement of LEDs, for example a regular formation of multiple rows and columns each containing a plurality of LEDs.

The array of LEDs may be an array of LEDs manufactured using the method of the second aspect of the invention.

Preferably the array is an array of micro-LEDs which emit light of two different colours due to the respective arrays of first and second LED structures.

The array of LEDs may additionally comprise a plurality of third LED structures configured to emit light at a third emission wavelength different from the first and second emission wavelengths.

Three-Colour LED Device

According to a sixth aspect of the present invention there is provided a three colour LED device, comprising:

- a first LED structure, which is configured to emit light at a first emission wavelength, over a first porous region of III-nitride material;
- a second LED structure, which is configured to emit light at a second emission wavelength different from the first emission wavelength, the second LED structure not being positioned over the first porous region;
- a third LED structure, which is configured to emit light at a third emission wavelength different from the first and second emission wavelengths, the third LED structure not being positioned over the first porous region.

Particularly preferably, the three-colour LED device is a red-green-blue (RGB) LED device, and the first, second and third LED structures are configured to emit red, green and blue light under an applied electrical bias.

As described above, the second LED structure may be positioned over a second porous region having a porosity different from the porosity of the first porous region. The third LED structure may also be positioned over a third porous region having a porosity different from the porosity of the first porous region.

Alternatively, the second LED structure and/or the third LED structure may be positioned over a non-porous region of III-nitride material, the non-porous region of III-nitride material being arranged in the same plane as the first porous region. In this case, these LED structures will not benefit from the same strain relaxation wavelength-shift effect as the first LED structure.

In a preferred embodiment, the second LED structure is identical to the first LED structure, and the first and second LED structures emit light at different emission wavelengths due to the porous region beneath the first LED structure.

In a preferred embodiment, the first LED structure may be an LED structure for emitting at a peak wavelength of 515-540 nm under an electrical bias applied across the LED structure. The porous region of III-nitride material under the first LED structure may then shift the emission wavelength of the first light-emitting region of the LED structure to between 600 and 650 nm. Thus the first LED structure may emit red light.

In a preferred embodiment, the second LED structure may also be an LED structure for emitting at a peak wavelength of 515-540 nm under an electrical bias applied across the LED structure. Preferably the second LED structure is not positioned over a porous region, so the second LED structure emits at the expected peak wavelength of 515-540 nm under an electrical bias. Thus the first LED structure may emit green light.

One or more light-emitting layers in the first LED structure and the second LED structure may have the composition $In_xGa_{1-x}N$, in which $0.10 \le x \le 0.40$, preferably $0.10 \le x \le 0.30$, particularly preferably $0.20 \le x \le 0.30$.

In particularly preferred embodiments the third LED structure may be configured to emit light at a peak wavelength between 415 and 500 nm under electrical bias thereacross, preferably between 430 and 470 nm under electrical bias thereacross.

Particularly preferably, the third LED structure may comprise one or more porous light-emitting layers. As described in WO2019/145728, the porosity of the light-emitting layers may advantageously create additional quantum confinement that leads to a blue-shift in the emission wavelength of the third LED structure, such that the third LED structure emits blue light when an electrical bias is applied across the structure.

In a particularly preferred embodiment, the first, second and third LED structures are configured so that:

- the first LED structure emits light at a peak wavelength between 560 nm and 750 nm, preferably between 600 and 650 nm, under electrical bias thereacross;
- the second LED structure emits light at a peak wavelength between 500 nm and 560 nm, preferably between 515 and 550 nm, under electrical bias thereacross; and
- the third LED structures emits light at a peak wavelength between 400 and 500 nm, preferably between 430 nm and 470 nm under electrical bias thereacross.

All of the features described above in relation to any of the first, second, third, fourth, fifth or sixth aspects of the invention are equally applicable to the other aspects of the invention.

Preferred Aspects

The method may comprise the steps of:

- preparing a semiconductor structure of III-nitride semiconductor material, which is suitable for through-surface electrochemical porosification using the method set out in WO2019/063957;
- porosifying a first portion of the semiconductor structure;
- porosifying a second portion of the semiconductor structure to a porosity different from that of the first portion; and
- overgrowing a light-emitting semiconductor device structure on top of the first and second portions.

The inventors have found that electrochemical porosification of III-nitride material leads to strain relaxation in the semiconductor lattice. The extent of the strain relaxation is related to the pores' sizes and locations, and the degree of porosification (% porosity) of the lattice. Therefore porosifying two discrete portions of the semiconductor structure to different porosities means that the first and second portions experience different degrees of strain relaxation. Strain relaxation of the semiconductor lattice leads to a shift in the emission wavelength of a light-emitting semiconductor device overgrown onto the structure, so the different porosities of the first and second portions means that the device overgrown on the first portion will have a different emission wavelength to the device overgrown on the second portion of the structure. In this way, the same layered semiconductor structure can emit light at more than one discrete wavelength without any need to use different semiconductor materials. This may advantageously provide a significantly more efficient method of preparing multiwavelength devices.

The semiconductor structure is preferably a multi-layer structure of III-nitride material, optionally attached to a substrate. In order for the III-nitride material to be porosifiable, the material to be porosified should be n-type doped and have a doping concentration in the range of $1\times10^{17}$ to $1\times10^{20}$.

Particularly preferably, the semiconductor structure is a semiconductor wafer, or a portion of a semiconductor wafer.

Preferably the semiconductor structure comprises (In)GaN, and preferably the light-emitting semiconductor device comprises InGaN.

The first and second portions of the semiconductor structure may be formed by masking the upper surface of the semiconductor structure before electrochemical porosification. The mask may be, for example, $SiO_2$, $Al_2O_{30}$r any other conventional etch mask.

The first portion is preferably a column of semiconductor material comprising a first area of the surface layer of the semiconductor structure, and also the corresponding area of multiple sub-surface layers positioned directly below the first area.

Likewise the second portion is preferably a column of semiconductor material comprising a second area of the surface layer of the semiconductor structure, and also the corresponding area of multiple sub-surface layers positioned directly below the second area.

First and second portions of the semiconductor structure can be formed with discrete porosity profiles by virtue of the through-surface etching mechanism described in WO2019/063957, whereby electrolyte is brought into contact with the surface layer of the structure, which can either be undoped or n-doped, and porosification proceeds downwards into the structure. In this mechanism, regions of sub-layers that are below the surface area in contact with the electrolyte are porosified, while regions of sub-layers that are not beneath an electrolyte-contacting area are not porosified. This allows discrete regions of the semiconductor structure to be porosified without porosifying the entire structure.

Alternatively, the first and second portions may be formed by forming trenches in the semiconductor wafer to create discrete "mesas". A first mesa may form the first portion of the semiconductor structure, and a second mesa may form the second portion of the semiconductor structure. The mesas could then be separately porosified using the "lateral" etching mechanism that is common in the prior art, where electrolyte proceeds inwards from the exposed edges of a semiconductor structure.

Thus the device of the present invention may be formed either by through-surface porosification or lateral porosification.

The first and second portions typically contain separate areas of the same semiconductor layers. As the doping of the layers may be uniform in a wafer-scale layered template, the degree of porosification of the first and second layers may be controlled without being determined solely by the charge carrier concentration in each respective portion.

The degree of porosification of the first and second portions may be controlled, rather, by porosifying the first portion separately from the second portion, and applying different electrical parameters to each. For example, the voltage applied during porosification of the first portion may be different to the voltage applied during porosification of the second portion. Thus, even when the layer structure and charge carrier profile of the first and second portions is identical, the first and second portions may be porosified to different degrees, with the result that one of these portions ends up being more porous than the other.

To prepare different portions with different porosities, in constant voltage EC etching mode, the voltage may be varied for a given doping concentration. Alternatively the doping concentration may be varied for a given voltage, by preparing a template in which the first and second portions are grown with different doping profiles.

Similarly, in constant current EC etching mode, different portions with different porosities can be prepared by varying the etching current in the similar way relative to the doping concentration.

Porosity can also be controlled and varied by changing the electrolyte concentration (i.e.

0.01M to highly concentrated of whatever M it might be), processing temperature (−30-60° C.), and other atmospheric parameters, and by providing UV illumination. One or more of these factors may be varied between the steps of porosifying the first region and porosifying the second region, in order to end up with different porosity profiles in the two regions.

The first and second portions may be porosified separately from one another by only contacting one portion with electrolyte during each porosification step, for example by masking the rest of the surface layer.

The mask may optionally be removed before epitaxially overgrowing the semiconductor device onto the porous semiconductor structure.

By porosifying further portions of the semiconductor structure to different porosities, further emission wavelengths may be achieved. For example a third portion of the semiconductor structure may be porosified to a porosity different from the first and second portions. The degree of strain relaxation will be different for this portion of the structure, and therefore the emission wavelength of the overlying light-emitting device will be different.

In an exemplary first step, a mask resist may be applied to the surface layer of the semiconductor structure, so that only two areas of the surface layer—a first area and a second area—remain exposed.

In the second step, the semiconductor structure is electrochemically porosified to create a first porous region (in the form of a column of porous material extending downwards from the surface) below the first area, by exposing the first area to electrolyte and applying an etching voltage. In the multi-layer structure of the semiconductor structure, more conductive layers are porosified to a greater extent than less conductive layers.

The semiconductor structure is also electrochemically porosified to create a second porous region (in the form of a column of porous material extending downwards from the surface) below the second area, by exposing the second area to electrolyte and applying an etching voltage. The second area is porosified separately from the first area, and different electrochemical etching control parameters, such as etching time and etching voltage, are used for each respective area. This means that the resulting porosity profile of the second porous region is different from that of the first porous region. Although, like the first portion, the porosity within the second region varies from layer to layer depending on initial conductivity, the overall porosity profile of the second porous region is different from that of the first porous region. This is despite their pre-etching compositions and structures being the same.

In the third step, the mask is removed from the surface layer.

In the fourth step, a light-emitting semiconductor device is overgrown on top of the surface layer, consisting of an InGaN interlayer, InGaN quantum wells (QWs) and an upper layer of p-(In)GaN.

As the first porous region and the second porous region have different degrees of strain relaxation, this will result in the light-emitting device having a different emission wavelength over the first porous region compared to the second porous region.

In a further aspect there is provided a semiconductor device comprising:

- a semiconductor structure having a first porous portion, and a second porous portion with a different porosity to the first porous portion; and
- one or more light-emitting semiconductor structures arranged above the first porous portion and the second porous portion, in which the light-emitting semiconductor structure above the first porous portion emits light at a first wavelength, and the light-emitting semiconductor structure above the second porous portion emits light at a second wavelength different from the first wavelength.

BRIEF DESCRIPTION OF THE DRAWINGS

Specific embodiments of the invention will now be described with reference to the figures, in which:

FIG. 5 illustrates a semiconductor structure for porosification to form a template suitable for use with the present invention;

FIG. 6 illustrates a template containing a porous region and a non-porous region, suitable for use with embodiments of the present invention;

FIGS. 7-20 are schematic side-on cross-sections illustrating the steps of manufacturing a red-green-blue LED device according to a preferred embodiment of the present invention;

FIGS. 1 & 2

A template is provided, in which three porous regions having different porosities are positioned in the same plane, at three different lateral positions in a layer of semiconductor material. An n-doped connecting layer (not shown) covers all three porous regions.

First, an LED structure is then formed on the connecting layer over Porous regions 1, 2 and 3. The LED structure is then divided into three by conventional etching processes to leave a first LED structure positioned above Porous Region 3, a second LED structure positioned above Porous Region 2, and a third LED structure positioned above Porous Region 1.

Due to global and local strain relaxation, different regions may advantageously emit at Blue, Green, and Red wavelengths under an applied electrical bias.

All three LED structures are then processed into device structures with the same LED processing steps described above.

In this embodiment, the difference in porosity between Porous region 1, Porous region 2 and Porous region 3 will create different first, second and third emission wavelengths, even though the first, second and third LED structures themselves are the same. In the illustrated embodiment, the porosity of Porous region 1 causes a wavelength shift so that the first LED structure emits red light under an applied electrical bias. Thus a blue LED, a green LED and a red LED may be formed simultaneously, using the same epitaxial growth steps.

In various embodiments, instead of Porous regions 1 and 2, the second and/or third LED structures may be formed over non-porous regions of III-nitride material.

FIGS. 3 & 4

Figure 1:
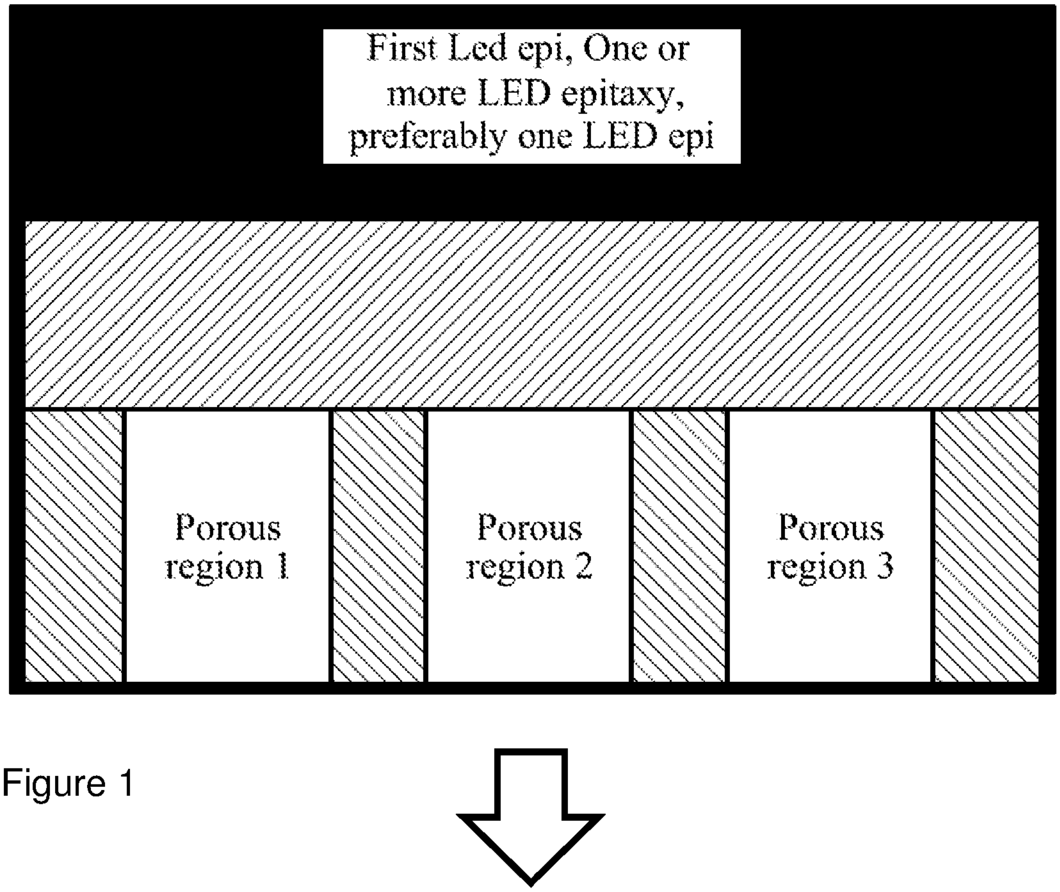
FIGS. 1 and 2 illustrate a method of preparing a red-green-blue LED device according to a preferred embodiment of the present invention.
Figure 2:
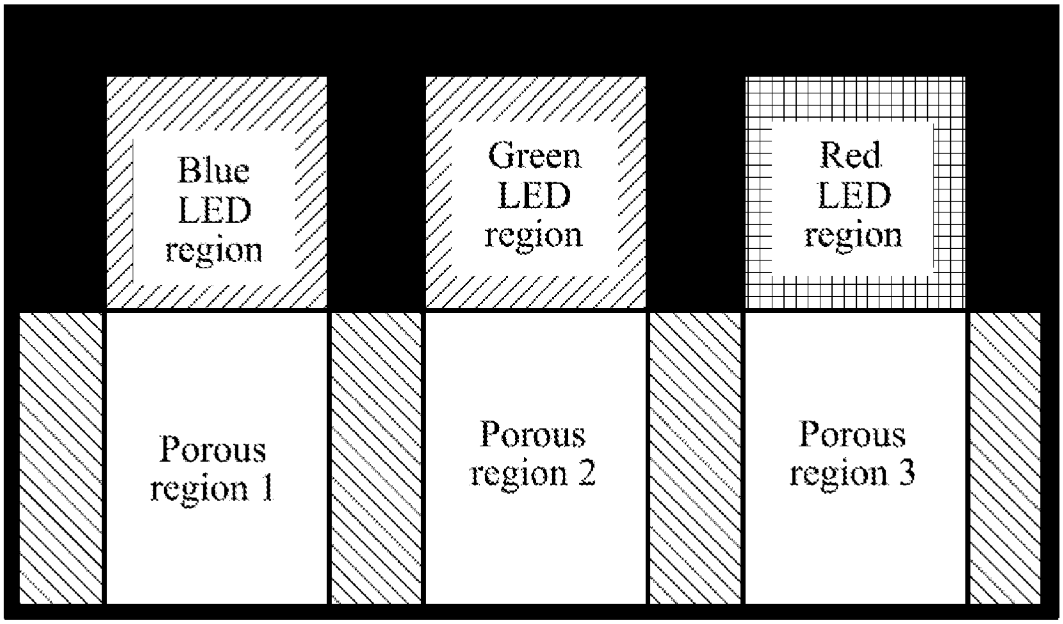
Figure 3:
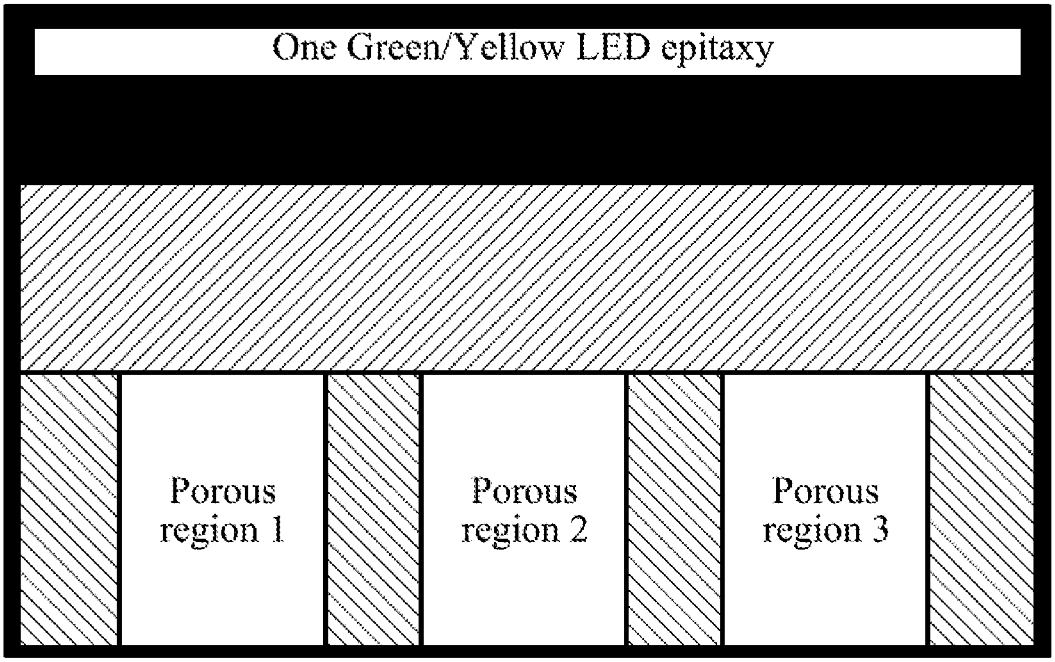
FIGS. 3 and 4 illustrate an alternative method of preparing a red-green-blue LED device according to a preferred embodiment of the present invention.
Figure 4:
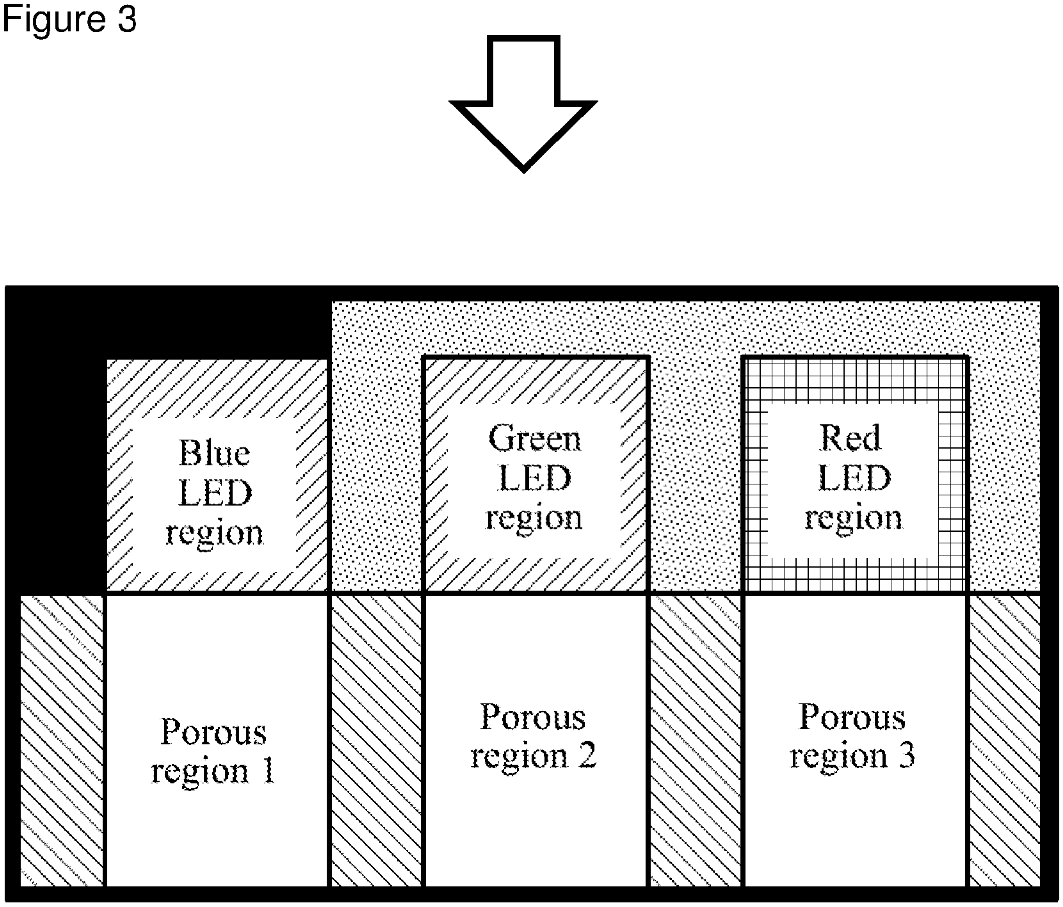
Figure 9:
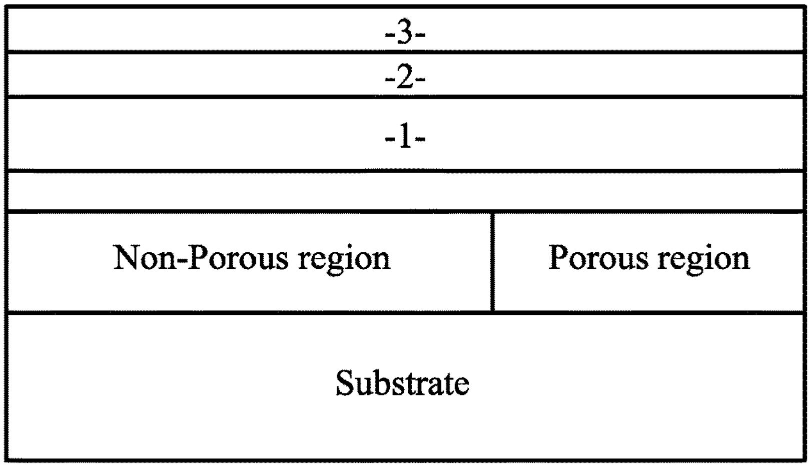
Figure 10:
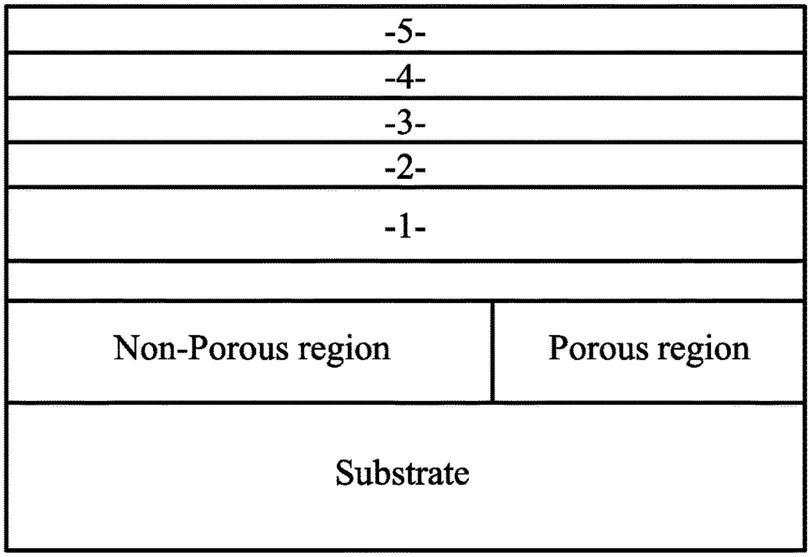
Figure 11:
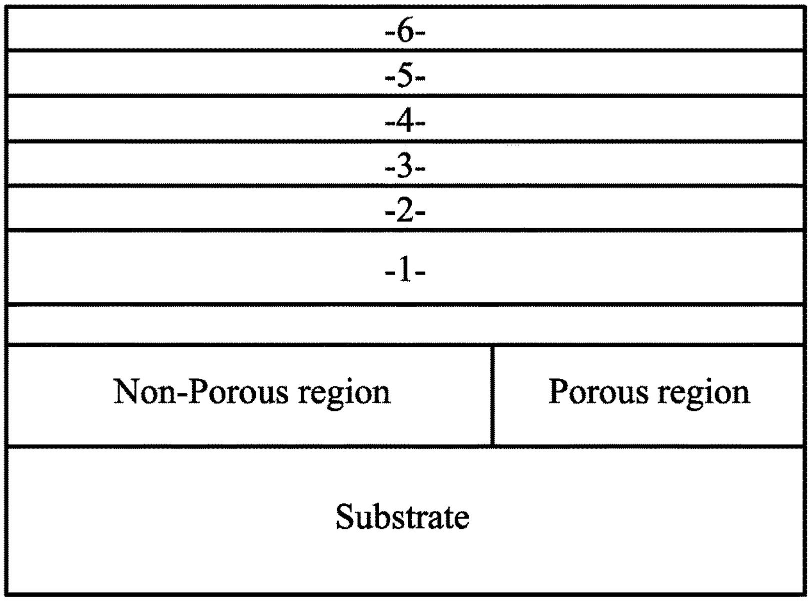

FIGS. 3 and 4 illustrate a method of preparing a red-green-blue LED device according to another preferred embodiment of the present invention.

A template is provided, in which three porous regions having different porosities are positioned in the same plane, at three different lateral positions in a layer of semiconductor material. An n-doped connecting layer (not shown) covers all three porous regions.

First, a conventional green or yellow LED structure is then formed on the connecting layer over Porous regions 1, 2 and 3. The LED structure is then divided into three by conventional etching processes to leave a first LED structure positioned above Porous Region 3, a second LED structure positioned above Porous Region 2, and a third LED structure positioned above Porous Region 1.

The first and second LED structures are then covered by a mask, leaving the third LED structure exposed.

A second electrochemical etch is then carried out on the exposed third LED structure, which porosifies the QWs in the green LED structure. The electrochemical porosification step may be performed using the known process described in WO2019/145728. As described in WO2019/145728, porosifying the quantum well layers results in a blue-shift in the emission spectrum of the LED structure.

All three LED structures are then processed into device structures with the same LED processing steps described above.

In this embodiment, the difference in porosity between Porous region 1, Porous region 2 and Porous region 3, and the porous light-emitting region of the third LED structure, will create different first, second and third emission wavelengths, even though the first, second and third LED structures themselves were grown in a single step. In the illustrated embodiment, the porosity of Porous region 1 causes a wavelength shift so that the first LED structure emits red light under an applied electrical bias. The porous QWs mean that the third LED structure emits blue light under an applied electrical bias. While the second LED structure emits green light under an applied electrical bias. Thus a blue LED, a green LED and a red LED may be formed simultaneously, using the same epitaxial growth steps.

In various embodiments, instead of Porous regions 1 and 2, the second and/or third LED structures may be formed over non-porous regions of III-nitride material.

FIG. 5—SUBSTRATE & III-NITRIDE LAYER FOR POROSIFICATION

A compatible substrate is used as a starting surface for epitaxy growth. The substrate may be Silicon, Sapphire, SiC, β-Ga2O3, GaN, glass or metal. The crystal orientation of the substrates can be polar, semi-polar or non-polar orientation. The substrate size may vary from 1 $cm^2$, 2 inch, 4 inch, 6 inch, 8 inch, 12 inch, 16 inch diameters and beyond, and the substrate may have a thickness of greater than 1 μm, for example between 1 μm and 15000 μm. Preferably the substrate is a semiconductor wafer. An advantage of the present invention is that an array of micro-LEDs may be manufactured simultaneously on a fully sized semiconductor wafer. While the illustrated example shows two micro-LEDs being formed on a shared template, the same method may be used to manufacture arrays of many micro-LEDs simultaneously on the same wafer.

A layer or stack of layers of III-nitride material is epitaxially grown on the substrate. The III-nitride layer may contain one or a combination of these elements: Al, Ga, In (binary, ternary or quaternary layer).

The thickness of the III-nitride layer to be porosified is preferably at least 1 nm, 5 nm, 10 nm, or at least 50 nm, or at least 100 nm, for example between 10-10000 nm, preferably between 10 nm and 4000 nm.

The III-nitride region to be porosified is a doped region having an n-type doping concentration between $1\times10^{17}$ $cm^{-3}$-$5\times10^{20}$ $cm^{-3}$. The doped region occupies only a portion of the width of the substrate. An undoped region of III-nitride material is arranged in the same plane as the doped region, so that the undoped region occupies the rest of the width of the substrate.

The III-nitride layer may also comprise an undoped layer (not shown) of III-nitride material over the doped region.

The doped region may terminate at the exposed upper surface of the III-nitride layer, in which case the surface of the layer will be porosified during electrochemical etching.

Preferably, the doped region of the III-nitride material is covered by an undoped intermediate (or "cap") layer of III-nitride material, so that the doped region is sub-surface in the semiconductor structure. The sub-surface starting depth (d) of the doped region may be between 1 nm and 3000 nm for example, or between 5 nm and 2000 nm.

In the example illustrated in FIGS. 5 to 20, a doped region of the III-nitride layer is porosified by known electrochemical porosification techniques to form a porous region of III-nitride material.

FIG. 6—TEMPLATE

After it is deposited on the substrate, the n-doped III-nitride region is porosified with a wafer scale porosification process as set out in international patent applications PCT/

GB2017/052895 (published as WO2019/063957) and PCT/GB2019/050213 (published as WO2019/145728). During this process, the n-doped III-nitride material become porous, while the undoped region of III-nitride material does not become porous. The degree of porosity of the porous layers is controlled by the electrochemical etching process and may preferably be between 10%-90%, preferably between 20% and 70%.

Following the porosification step, the template contains a porous region of III-nitride material in the same plane as a non-porous region of III-nitride material. The porous region and the non-porous region are of the same thickness, and both are covered by a non-porous intermediate layer overlying both the porous region and the non-porous region.

FIG. 7—CONNECTING LAYER

As shown in FIG. 6, after porosification, the template is overgrown with a connecting layer 1. The connecting layer is a n-doped III-nitride (preferably GaN) layer with a thickness of between 50 and 2000 nm (layer 1 in FIG. 7), preferably 200-1500 nm, even more preferably 500-1500 nm. The connecting layer is a n-doped III-nitride (preferably GaN) layer with an n-type charge carrier concentration of between $1\times10^{17}$ $cm^{-3}$-$5\times10^{20}$ $cm^{-3}$ and preferably $>1\times10^{18}$ $cm^{-3}$.

The connecting layer 1 is formed of III-nitride material and may contain one or a combination of these elements: Al, Ga, In (binary, ternary or quaternary layer). The connecting layer is doped with suitable n-type dopant materials, e.g Si, Ge, C, O.

In one example in-situ etching can be used to reduce the thickness of the intermediate layer prior to the growth of connecting layer 1.

FIG. 8—FIRST N-DOPED REGION

After the connecting layer 1 is formed, an n-doped layer 2 of III-nitride material is deposited over the connecting layer 1.

In the particular example shown, an n-doped layer 2 is grown by MOCVD. The growth takes place on the surface of the n-doped connecting layer 1. Si is used as a dopant in the n-doped layer 2, with a doping concentration of at least $>1\times10^{19}$ $cm^{-3}$.

The n-doped layer 2 may be a bulk III-nitride layer containing Indium or a stack of thin III-nitride layers with or without indium, or with a variation in atomic percentage of indium across the bulk layer or the stack. The Indium atomic percentage may vary between 0.5-25%. The total thickness of the n-type layer 2 may vary between 2 nm and 200 nm, for example between 50 nm and 100 nm. If the stack is used then the thickness of individual layer in the stack may vary between 1-40 nm. The n-doped layer 2 may have an n-doping concentration of between $1\times10^{17}$ $cm^{-3}$-$5\times10^{20}$ $cm^{-3}$.

FIG. 9—FIRST LIGHT EMITTING REGION

After growth of the first n-type layer 2 on the template, a light-emitting region 3 is grown.

The light-emitting region 3 may contain at least one light emitting layer. Each light emitting layer may be a quantum well (QW), preferably an InGaN quantum well (QW). Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum well preferably consists of an InGaN layer with atomic indium percentage between 10-30%, preferably above 20%, and preferably below 30%.

The thickness of each quantum well layer may be between 1.5-8 nm, preferably between 1.5 nm and 6 nm, or between 1.5 nm and 4 nm.

The quantum wells may or may not be capped with a thin (0.5-3 nm) Ill-nitride QW capping layer, which may contain one or a combination of these elements: Al, Ga, In (ternary of quaternary layer).

The QW capping layer, which (if present) is the layer added immediately after QW growth, can be AlN, AlGaN of any Al % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer).

The QW capping layer(s) and QW barriers are not indicated with individual reference numerals in the Figures, as these layers form part of the light emitting region 3.

The target emission wavelength of the light emitting region 3 under an applied electrical bias is between 515 nm-550 nm, preferably 530 nm. Thus the light emitting region 3 is preferably a green LED structure, configured to emit green light when an electrical bias is applied.

FIG. 10—CAPPED LAYER AND EBL

After growth of quantum wells a non-doped cap layer 4 is grown. Non-doped cap layer 4 may be termed a light-emitting-region cap layer, as this layer is formed after growth of the complete light emitting region, for example after the growth of the stack of QWs, QW capping layers and QW barrier layers.

The cap layer (light-emitting-region cap layer) 4 is a standard layer which is very well known in the growth schemes for III-nitride LEDs.

The thickness of cap layer can be between 5-30 nm, preferably between 5-25 nm or 5-20 nm.

Electron Blocking Layer (EBL)

After the cap layer 4, an electron blocking III-nitride layer 5 (EBL) containing Aluminium is grown. The thickness is of EBL can typically be between 10-50 nm. The Al % can be between 5-25% for example, though higher Al content is possible.

The EBL is doped with a suitable p-type doping material. The doping concentration can be between $5\times10^{18}$ $cm^{-3}$-$8\times10^{20}$ $cm^{-3}$.

FIG. 11—FIRST P-DOPED LAYER

A first p-doped layer 6 is grown above the electron blocking layer (EBL) 5.

The p-type region is preferably doped with Mg, and the p-type doping concentration of the p-type layer is preferably between $5\times10^{18}$ $cm^{-3}$-$8\times10^{20}$ $cm^{-3}$.

The p-doped III-nitride layer may contain In and Ga.

The doping layer is preferably between 20-200 nm thick, particularly preferably between 50-100 nm thick. The doping concentration may vary across the p-type layer and can have a spike in doping levels in the last 10-30 nm of the layer towards the LED surface, in order to allow better p-contact.

For activation of Mg acceptors in the p-doped layer, the structure may be annealed inside of MOCVD reactor or in an annealing oven. The annealing temperature may be in the range of 700-850° C. in N2 or in N2/O2 ambient.

As both the EBL and the p-doped layer are p-type doped, these layers may be referred to as the p-doped region.

This marks the completion of first LED structure (layers 2-6).

FIG. 12—MASK LAYER

The next step is to deposit a second mask layer 7 or a combination of passivation layers over the connecting layer 1 and the layers 2-6 of the first LED structure.

The masking layer 7 can be photoresist or dielectric material.

The second mask layer may be formed from SiO2, SiN, SiON, Aluminium, Tantalum or hafnium containing oxide, or a combination of these layers. The mask layer 7 is deposited via plasma enhanced chemical vapor deposition, via sputtering or any other suitable technique (e.g Atomic layer deposition). The thickness of the mask layer 7 may vary between 20-2000 nm.

Openings in Mask Layer

The next step is to create an exposed region of the p-doped layer 6 by removing a portion of the mask layer 7. This can be done via standard photolithography techniques, e-beam or nanoimprint techniques.

Figure 12:
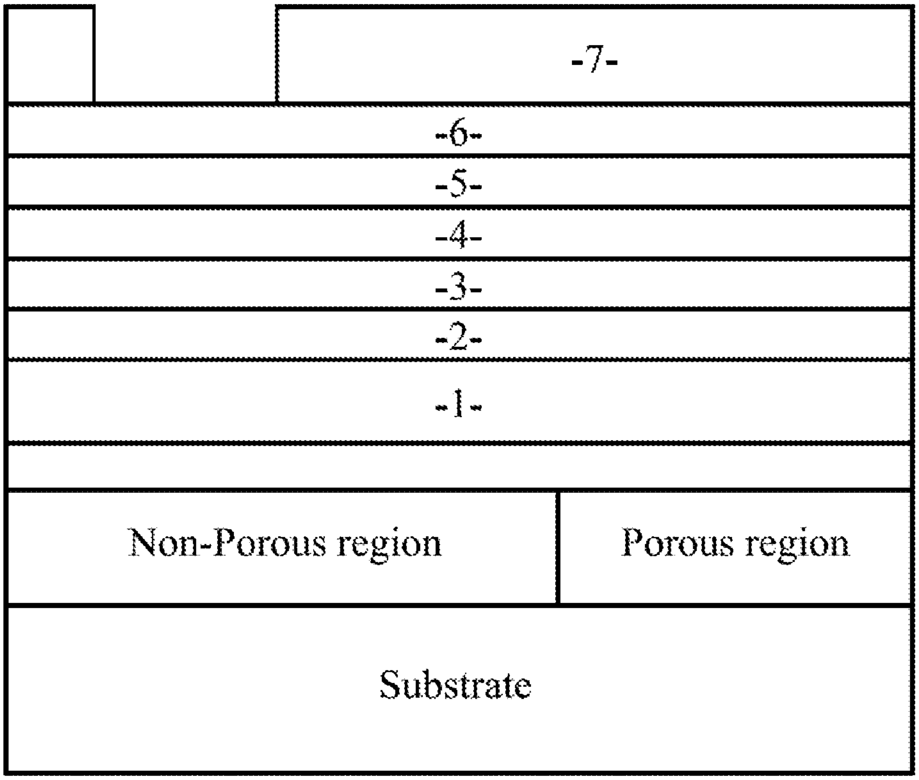
Figure 13:
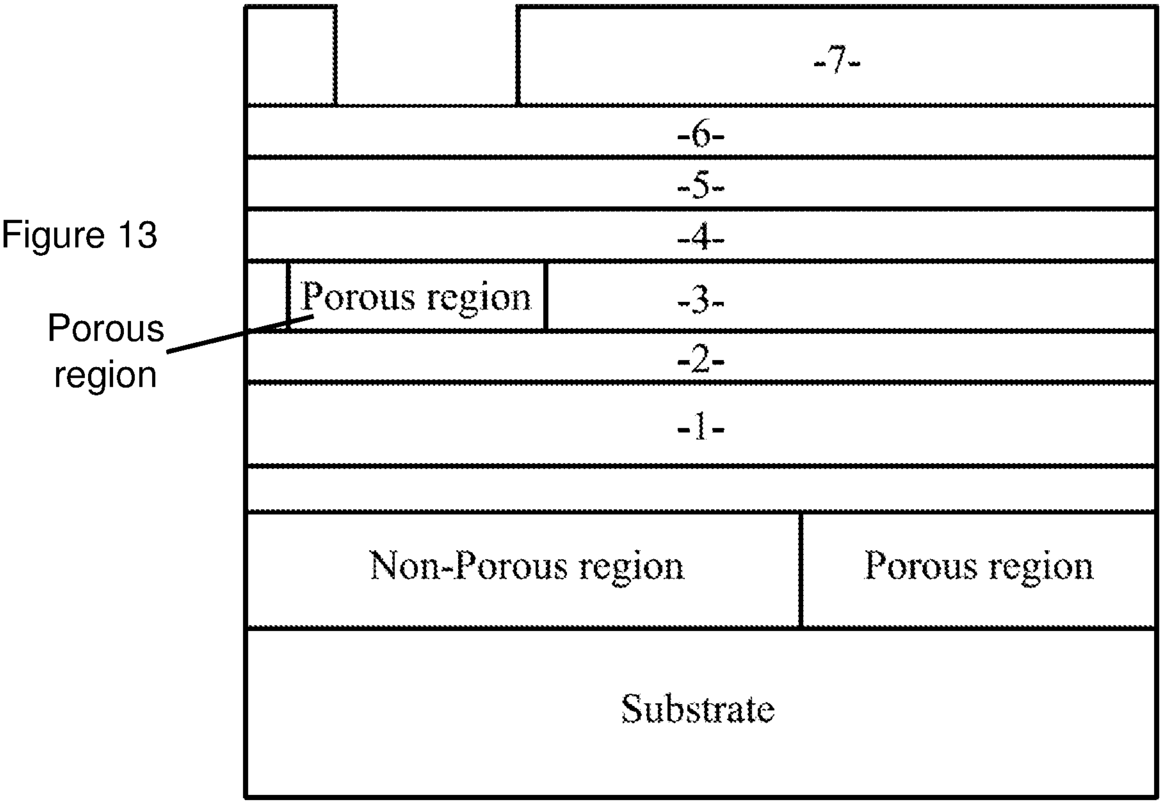
Figure 14:
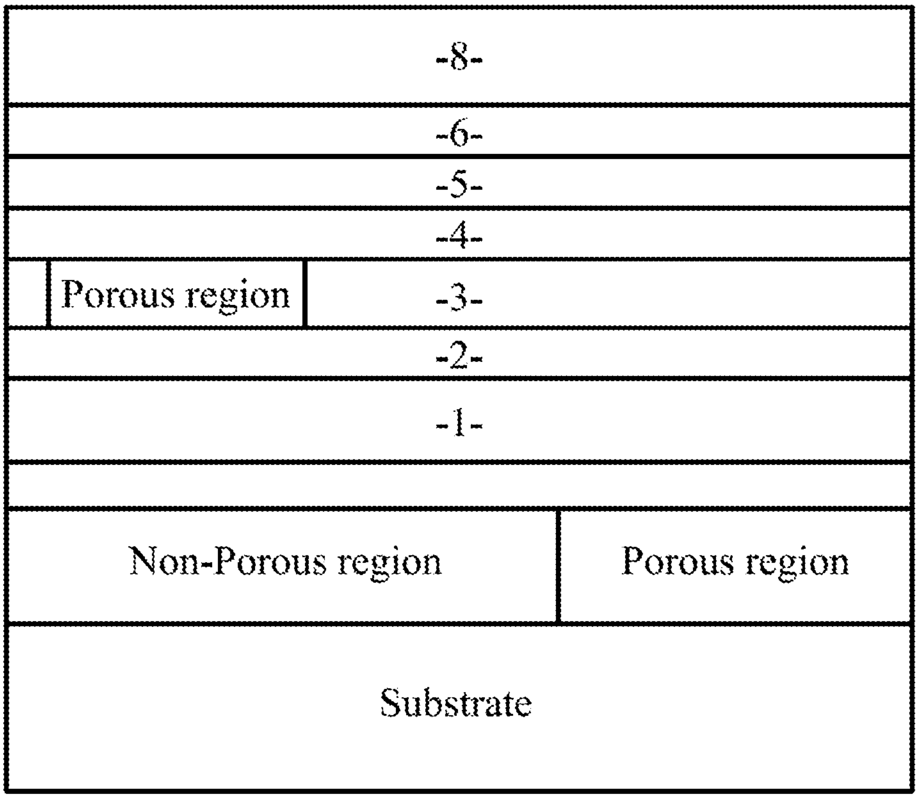

FIG. 12 shows one exposed region created through the mask layer 7 to expose the surface of the p-doped layer 6.

The size of the exposed regions may be between 200 nm and 50000 nm, preferably between 500 nm and 10000 nm, or between 1000 nm and 8000 nm.

The distance between the adjacent second exposed regions may be between 500 nm and 30000 nm, for example between 1000 nm and 10000 nm or between 5000 nm and 8000 nm.

FIG. 13—POROSIFYING A PORTION OF THE LIGHT-EMITTING REGION

A second electrochemical porosification step is then carried out on the exposed region, for etching the QWs in the light-emitting region. The electrochemical porosification step may be performed using the known process described in WO2019/145728. As described in WO2019/145728, porosifying the quantum well layers results in a blue-shift in the emission spectrum of the LED structure.

The electrochemical porosification step creates a porous region in the light-emitting region 3 only in a portion of the light-emitting region that is positioned below the exposed region of the p-doped layer 6. This forms porous quantum structures or nanostructures of InGaN in the light-emitting layers, hence localization effect kicks in, which results in a blue shift of the green LED structure, so that a blue LED can be achieved.

Mask layer 7 can then be removed. If mask layer 7 is a photoresist mask, then mask layer 7 is removed. If mask layer 7 is a dielectric material, then it can be combined with second mask layer 8 in FIG. 14.

FIG. 14—SECOND MASK LAYER

The next step is to deposit a second mask layer 8 or a combination of passivation layers over the entire structure. The second mask layer may be formed from a dielectric material, and may be deposited using conventional processes.

FIG. 15—OPENINGS IN SECOND MASK LAYER

The next step is to create a plurality of second exposed regions of the p-doped layer 6 by removing portions of the second mask layer 8. This can be done via standard photolithography techniques, e-beam lithography, or nanoimprint, which can be applied to defined patterns and mesas for the MicroLED pixels.

Figure 15:
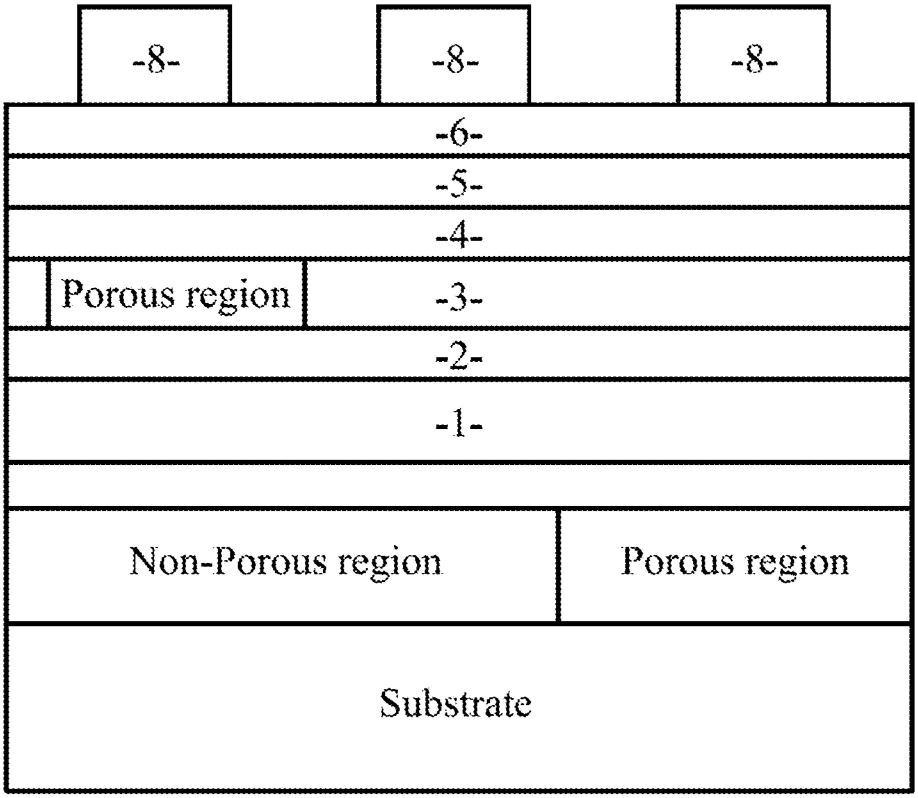
Figure 16:
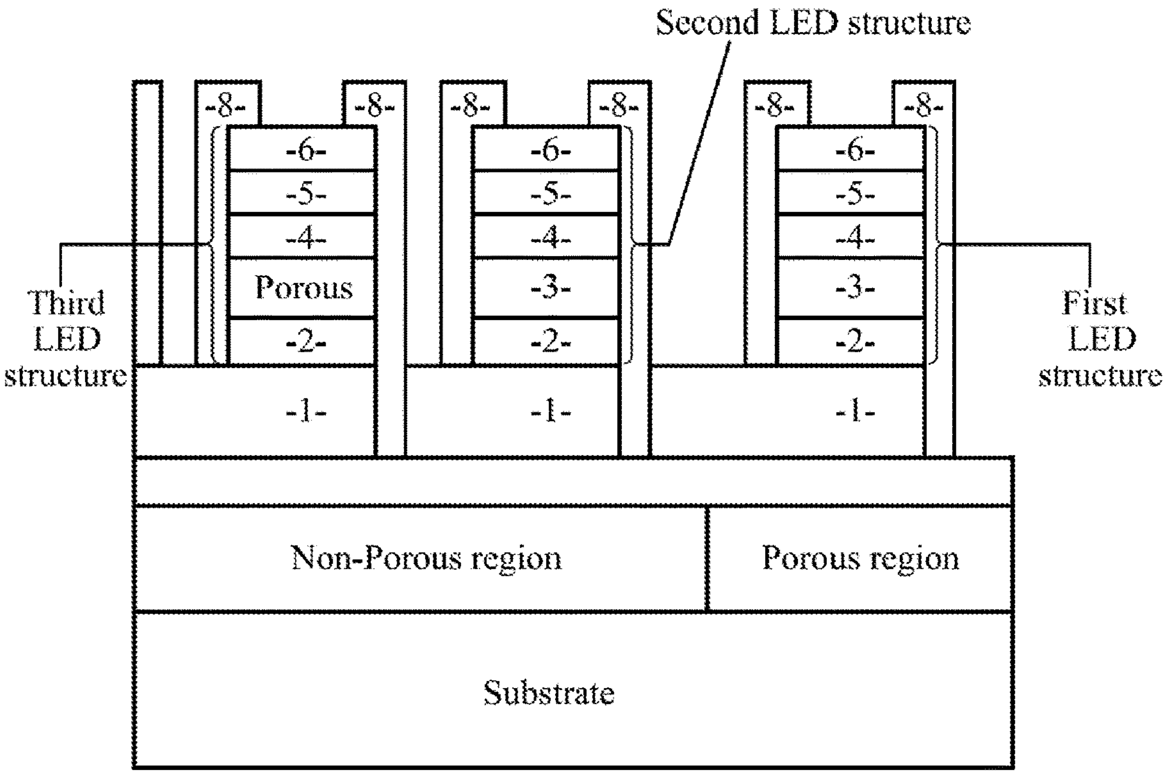
Figure 17:
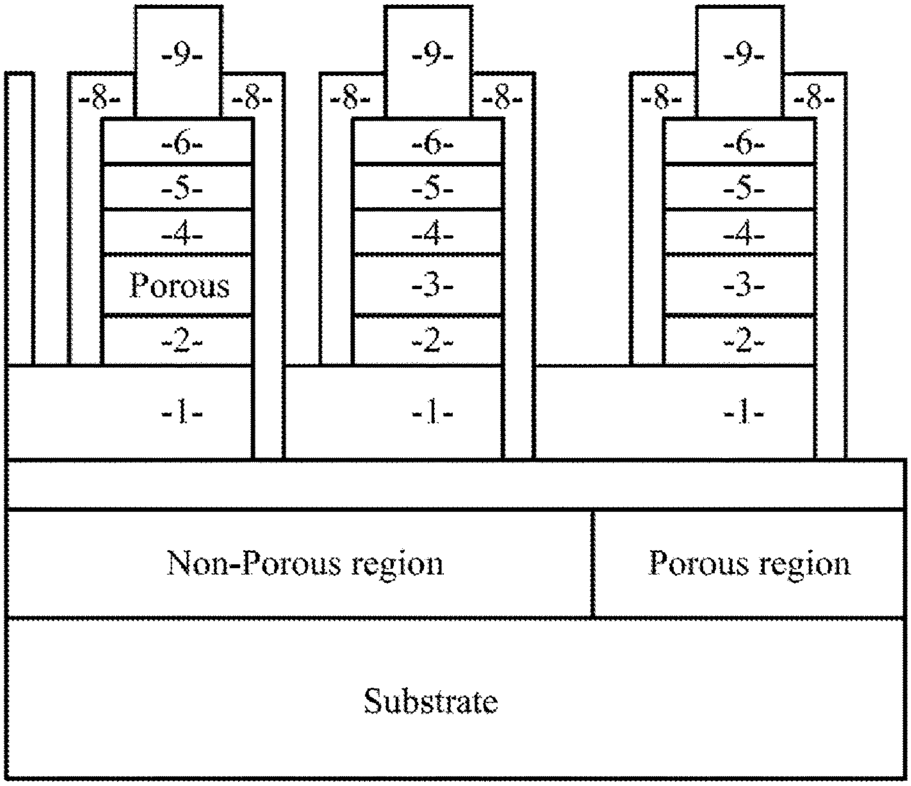
Figure 18:
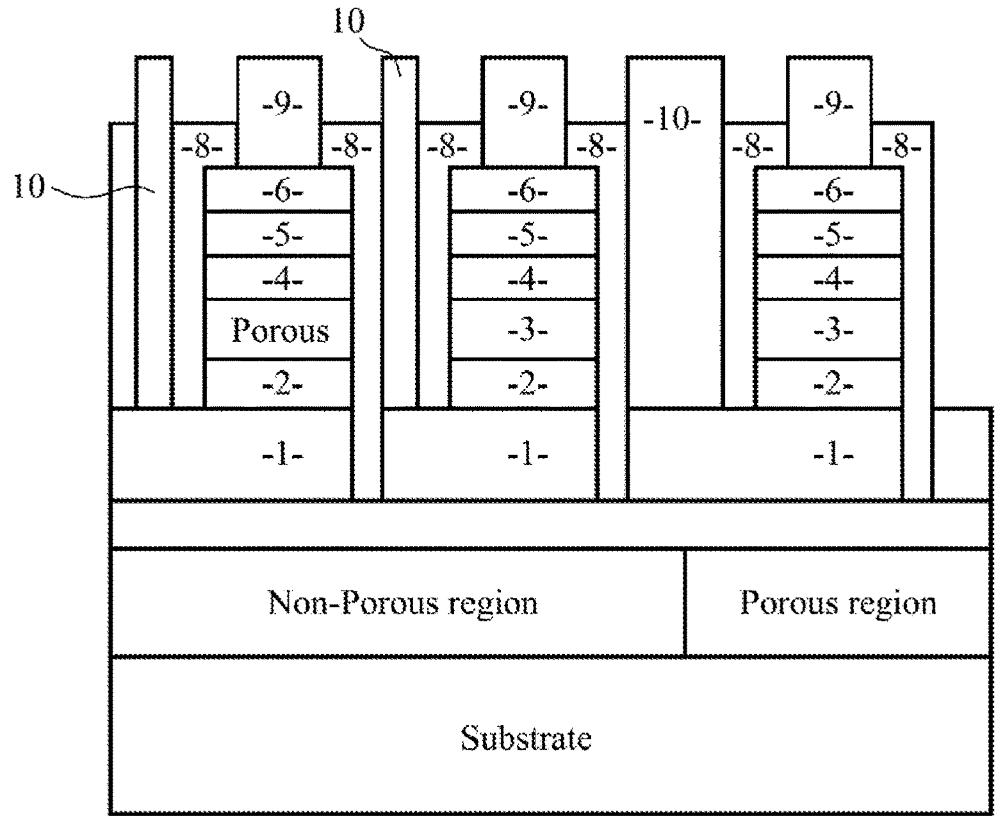
Figure 19:
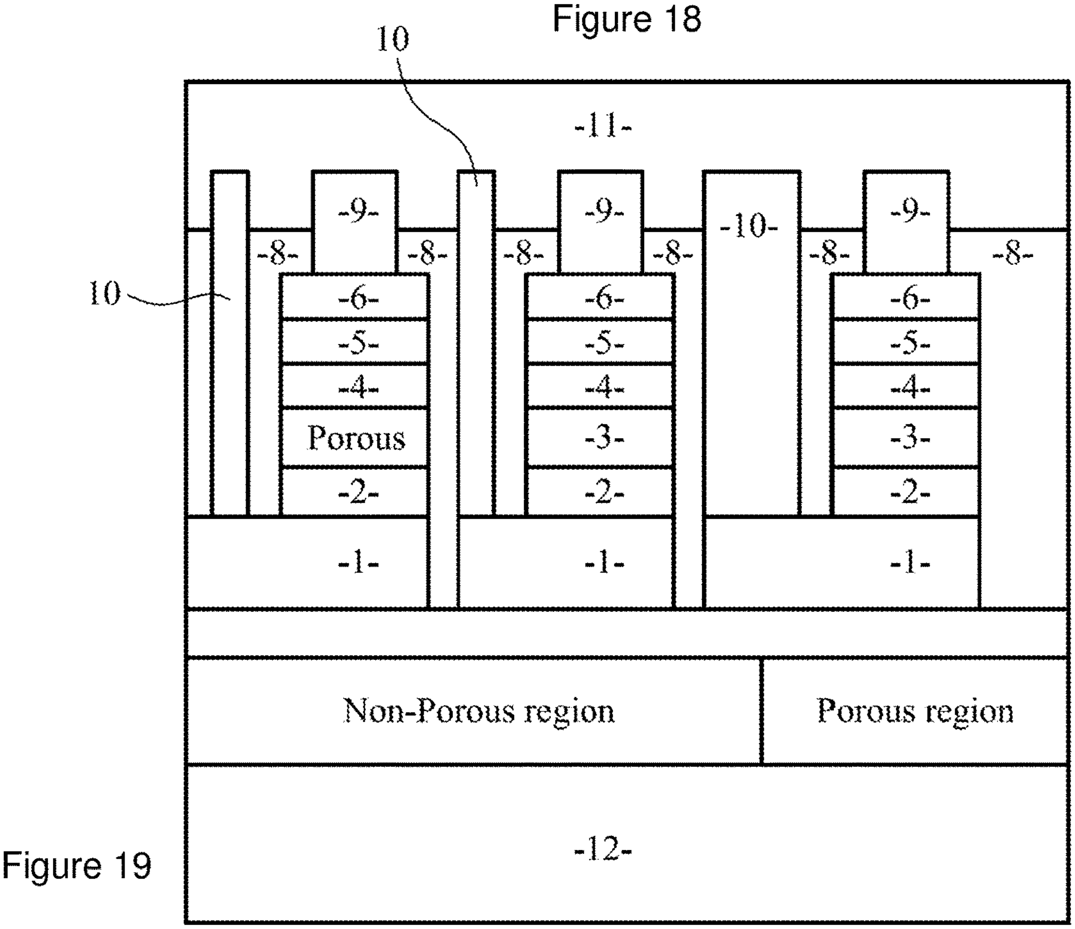

FIG. 15 shows three portions of the second mask layer 8 remaining on discrete regions of the p-doped layer 6.

A section of the mask layer 8 is left over the porous region in the light-emitting region 3, another section of the mask layer 8 is left above the non-porous region of the template, and another section of the mask layer 8 is left above the porous region of the template.

FIGS. 16 & 17

Standard photo-lithography, e-beam lithography, or nanoimprint can be applied to defined patterns and mesas for the MicroLED pixels.

Channels are etched through the second mask layer 8, the LED structure 2-6 and the connecting layer 1 to create three discrete "mesas" as three LED structures. The LED structure is divided into three discrete sections forming three discrete LED structures. A first LED structure is positioned above the porous region of the template. A second LED structure is positioned above the non-porous region in template. A third LED structure contains the porous region of the light-emitting region 3.

The three LED structures are then electrically isolated from one another by depositing dielectric mask material 8 into the channels.

Openings are then created to expose regions of the p-doped layer 6 on each of the three LED structures, and to expose regions of the n-doped connecting layer 1 on which each of the three LED structures are formed.

The next step in device fabrication is to cover the openings in oxide with transparent conducting oxide (e.g ITO, ZnO on other compatible oxides) or with metal layers 9. The covering can be done with a single step or multiple steps. The metals can be covering the pixels completely or partially. The metal may contain Ti, Pt, Pd, Rh, Ni, Au, Ag etc. The thickness of the complete metal stack can be between 200-2000 nm.

The structuring can be done be using standard semiconductor processing methods that included resist coating and photolithography/lift off.

This can be combined with dry or wet structuring so that the conducting metal layer 9 is only fully or partially covering top of p-doped regions 6.

The next step in device fabrication is to cover the openings in the mask layer 8 with metal layers 9. The covering can be done with a single step or multiple steps. The metals can be covering the pixels completely or partially. In this example a single step is used to simplify the details. The metal may contain Ti, Pt, Pd, Rh, Ni, Au. The thickness of the complete metal stack can be between 200-2000 nm.

Standard photolithography techniques can be used to create openings in the second mask layer 8 to expose a plurality of regions of the connecting layer 1. The size of the openings can vary between 200 nm-50000 nm. This distance between the openings can be between 500 nm-30000 nm. The openings are created only in the regions between LED structures. Dry etching is used to etch the mask layer using fluorine based gases.

FIG. 18

The final step in device fabrication is to cover the openings in the mask 8 with metal layers to access the n-doped connecting layer 1. The covering can be done with a single step or multiple steps. The metals can be covering the pixels completely or partially. In this example a single step is used to simplify the details. The metal may contain Ti, Pt, Pd, Rh, Ni, Au. The thickness of the complete metal stack can be between 200-2000 nm.

FIG. 19

The substrate can be removed or retained. In one case, the substrate is removed and transferred or attached to another substrate. The top electrodes are then bonded to another carrier wafer/substrate 11 or a microdriver circuit board or backplane to form an array of pixels. The bottom-side of the device may be bonded to a cover glass or transparent material 12.

Figure 20:
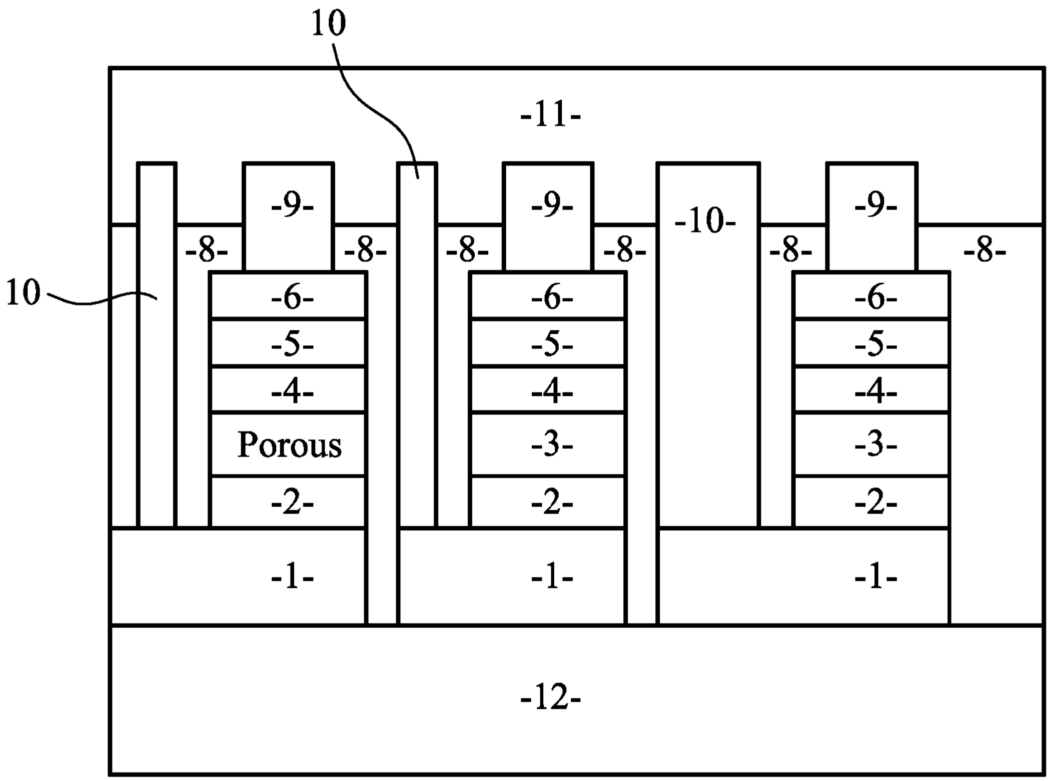

As shown in FIG. 20, the substrate and the porous and non-porous region may be removed from the device. The top side of the device may be bonded to another carrier wafer/substrate/backplane 11, or to a microdriver circuit board to form an array of pixels. The bottom-side of the device may be bonded to a cover glass or transparent material 12.

The completed structure as illustrated therefore includes a first LED structure with an emission wavelength between 560-650 nm and 650-750 nm, preferably 600-650 nm. The first LED structure may therefore be a red LED. The first LED structure is preferably the LED structure positioned over the porous region of the template, so that the strain relaxation of the porous region creates a red-shift in the emission wavelength of the first LED structure.

The completed structure also includes a second LED structure with an emission wavelength between 500-560 nm, preferably 520-540 nm. The second LED structure may therefore be a green LED. The second LED structure is preferably the LED structure positioned over the non-porous region of the template, which does not contain a porous region of the light-emitting region 3.

The completed structure also includes a third LED structure with an emission wavelength between 400-500 nm, preferably 430-470 nm. The third LED structure may therefore be a blue LED. The third LED structure is preferably the LED structure positioned over the non-porous region of the template, which contains the porous region of the light-emitting region 3, so that the quantum confinement of the porous light-emitting region creates a blue-shift in the emission wavelength of the third LED structure.

By providing all three of these LED structures in an integrated device, manufactured on the same substrate, a red-green-blue LED device is advantageously provided, in which red, green and blue LED structures form coloured pixels for light emission, particularly in which the red, green and blue pixels are formed in closer proximity than has been possible using prior art manufacturing methods.

The skilled person will understand that the emission wavelengths of the individual LED structures may be controlled by altering the composition and layer structures of the LED structures according to known principles of LED construction. Thus a variety of multi-coloured LED devices may be provided using the present invention, and colour combinations other than red, green and blue may of course be provided.

Red Shift

Figure 21:
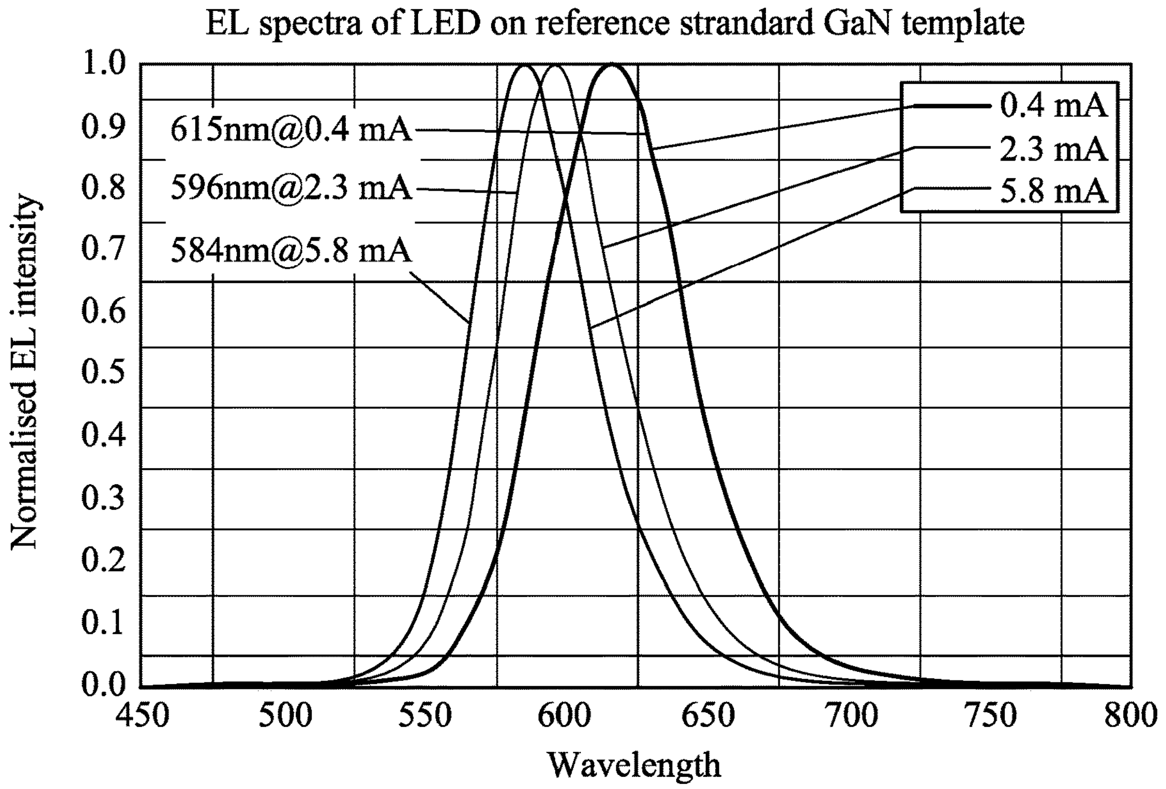
FIG. 21 is a graph of normalised electroluminescence (EL) intensity vs wavelength at different current injections, for an InGaN LED on a non-porous substrate.
Figure 22:
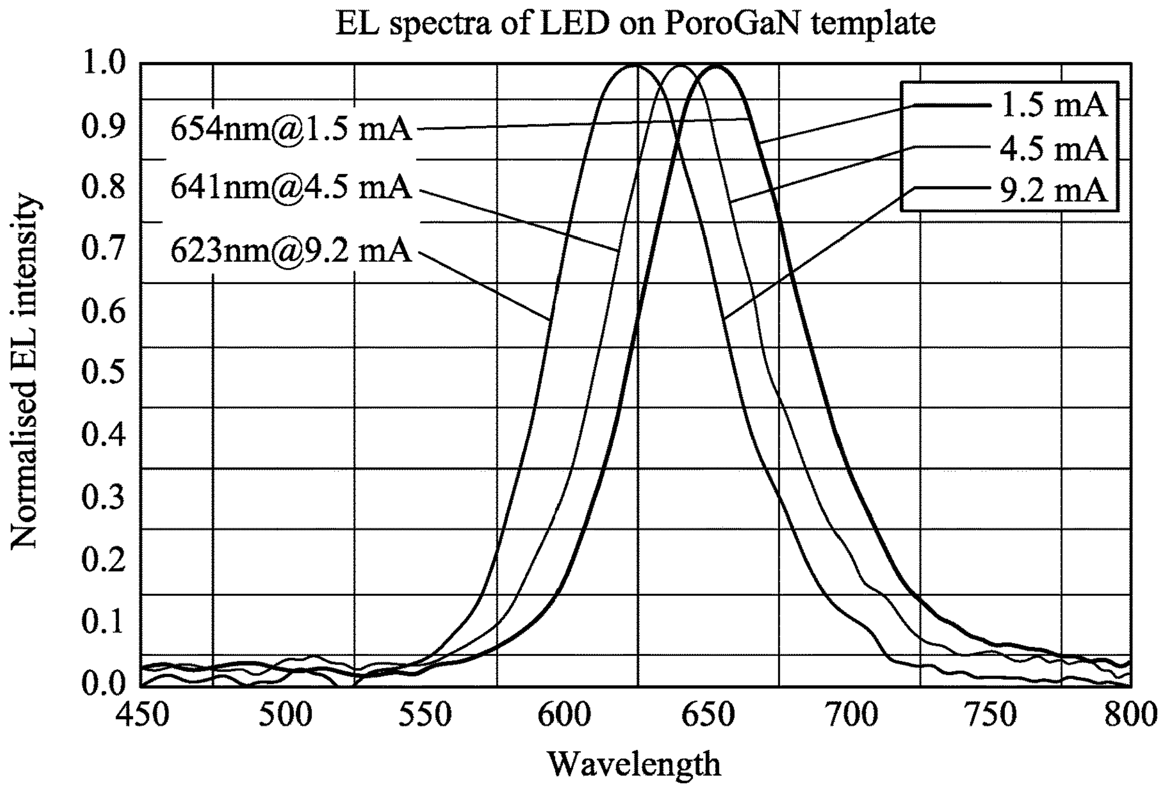
FIG. 22 is a graph of normalised electroluminescence (EL) intensity vs wavelength at different current injections, for the same InGaN LED as FIG. 21 grown over a porous region according to a preferred embodiment of the present invention.

FIGS. 21 and 22 compare the emission characteristics of an InGaN LED on a non-porous substrate (FIG. 21) and the same InGaN LED grown on a template comprising a porous layer of III-nitride material. Comparison of these two graphs demonstrates the shift towards longer emission wavelengths caused by the porous underlayer, as the emission of the LED on the porous template is consistently between 21 nm and 45 nm longer than that of the same LED on the non-porous template. Thus when the first LED structure is grown over the porous region and the identical second LED structure is grown over the non-porous region, the first LED structure light emits at a longer wavelength than the second LED structure.

The invention claimed is:

1. A method of manufacturing a light-emitting diode (LED) device, the method comprising:

providing a template comprising a first porous region of III-nitride material;

forming a first LED structure on the template above the first porous region; and forming a second LED structure on the template, in which the second LED structure is not positioned above the first porous region, in which the template comprises anon-porous intermediate layer of III-nitride material above the first porous region, and in which the first and second LED structures are formed on the non-porous intermediate layer.

2. A method according to claim 1, in which the method comprises forming the first porous region of III-nitride material by electrochemical porosification through a non-porous layer of III-nitride material, such that the non-porous layer of III-nitride material forms the non-porous intermediate layer over the first porous region.

3. A method according to claim 1, in which the template comprises a second porous region of III-nitride material in a same plane as the first porous region, and in which the method comprises forming the second LED structure above the second porous region of the template.

4. A method according to claim 3, in which the template comprises a third porous region of III-nitride material in the same plane as the first porous region and the second porous region, and in which the method comprises forming a third LED structure above the third porous region of the template.

5. A method according to claim 3, in which the first porous region of III-nitride material has a first porosity; and the second porous region of III-nitride material has a second porosity different from the first porosity.

6. A method according to claim 1, in which the template comprises a non-porous region of III-nitride material in a same plane as the first porous region, and in which the method comprises forming the second LED structure above the non-porous region of the template.

7. A method according to claim 1, in which forming the first LED structure and the second LED structure comprise:

forming an LED structure over the template, the LED structure comprising an n-doped portion; a p-doped portion; and a light emitting region located between the n-doped portion and the p-doped portion; and dividing the LED structure into a plurality of LED structures, to form the first LED structure above the first porous region and the second LED structure that is not positioned above the first porous region.

8. A method according to claim 1, comprising:

forming a first electrically-insulating mask over the first porous region;

forming a second LED structure on an unmasked region of the template;

forming a second electrically-insulating mask over the second LED structure;

exposing the first porous region; and forming the first LED structure on the first porous region.

9. A method according to claim 1, comprising forming a third LED structure on the template, in which the third LED structure is not positioned above the first porous region.

10. A method according to claim 9, in which the third LED structure is formed over a non-porous region of the template.

11. A method according to claim 10, comprising:

dividing the LED structure to form the first LED structure above the first porous region, the second LED structure not above the first porous region and the third LED structure.

12. A method according to claim 1, comprising:

forming an LED structure over the template;

forming a mask over the LED structure;

exposing an exposed region of the LED structure;

electrochemically porosifying the light-emitting region beneath the exposed region to form a porous portion of the light-emitting region of the LED structure.

13. A light-emitting diode (LED) device, comprising:

a first porous region of III-nitride material, a non-porous intermediate layer of III-nitride material above the first porous region, a first LED structure, over the first porous region of III-nitride material; and a second LED structure which is not positioned over the first porous region, in which the first LED structure and the second LED structure are positioned on the non-porous intermediate layer of III-nitride material.

14. An LED device according to claim 13, in which the first LED structure is configured to emit light at a first emission wavelength, and the second LED structure is configured to emit light at a second emission wavelength different from the first emission wavelength.

15. An LED device according to claim 13, in which the second LED structure is positioned over a second porous region of III-nitride material, the second porous region having a different porosity from the first porous region.

16. An LED device according to claim 15, in which the first and/or second porous region of III-nitride material comprises a stack of multiple porous layers of III-nitride material.

17. An LED device according to claim 13, in which the first LED structure comprises:

a first n-doped portion;

the first p-doped portion; and a first light emitting region located between the first n-doped portion and the first p-doped portion, and in which the second LED structure comprises:

a second n-doped portion;

a second p-doped portion; and a second light emitting region located between the second n-doped portion and the second p-doped portion.

18. An LED device according to claim 17, in which the first and/or second n-doped portion comprises an n-doped III-nitride layer which comprises n-GaN, or n-InGaN, or a stack of alternating layers of n-GaN/n-InGaN, or a stack of alternating layers of n-InGaN/n-InGaN containing different concentrations of indium.

19. An LED device according to claim 13, in which the one or more light-emitting layers in the first LED structure and the second LED structure have the composition $In_xGa_{1-x}N$, in which $0.10 \leq x \leq 0.30$.

20. An LED device according to claim 13, in which the second LED structure is identical to the first LED structure, and in which the first and second LED structures emit light at different emission wavelengths due to the porous region beneath the first LED structure.

21. An LED device according to claim 13, in which the LED device additionally comprises a third LED structure formed over the non-porous region of III-nitride material.

22. An LED device according to claim 21, in which one of the first, second or third LED structures emits red light under electrical bias thereacross; one of the first, second or third LED structures emits green light under electrical bias thereacross; and one of the first, second or third LED structures emits blue light under electrical bias thereacross.

23. An array of LEDs, comprising a plurality of LED devices according to claim 21, formed on a substrate.

24. An LED device according to claim 21, in which one or more light-emitting layers in the third LED structure are porous.

25. An LED device according to claim 13, in which the LED device additionally comprises a third porous region of III-nitride material having a third porosity, and a third LED structure on the third porous region.

26. An LED device according to claim 13, in which or in which the second LED structure is positioned over a non-porous region of III-nitride material, the non-porous region of III-nitride material being arranged in the same plane as the first porous region.

27. A three colour light-emitting diode (LED) device, comprising:

a first LED structure, which is configured to emit light at a first emission wavelength, over a first porous region of III-nitride material;

a second LED structure, which is configured to emit light at a second emission wavelength different from the first emission wavelength, the second LED structure not being positioned over the first porous region;

a third LED structure, which is configured to emit light at a third emission wavelength different from the first and second emission wavelengths, the third LED structure not being positioned over the first porous region, in which the second LED structure and/or the third LED structure is positioned over a non-porous region of III-nitride material, the non-porous region of III-nitride material being arranged in a same plane as the first porous region.

28. A three colour LED device according to claim 27, in which the three-colour LED is a red-green-blue (RGB) LED device, and the first, second and third LED structures are configured to emit red, green and blue light under an applied electrical bias.

29. A three colour LED device according to claim 27, in which the first LED structure is an LED structure for emitting at a peak wavelength of 515-540 nm, and in which the porous region of III-nitride material under the first LED structure shifts the emission wavelength of the light-emitting region to between 600 and 650 nm, and/or in which the third LED structure is configured to emit light at a peak wavelength between 400 and 500 under electrical bias thereacross.

30. A three colour LED device according to claim 27, in which the first, second and third LED structures are configured so that:

the first LED structure emits light at a peak wavelength between 600 and 650 nm under electrical bias thereacross;

the second LED structure emits light at a peak wavelength between 515 and 550 nm under electrical bias thereacross; and the third LED structure emits light at a peak wavelength between 415 and 500 nm under electrical bias thereacross.

* * * * *